United States Patent
Kobatake

(10) Patent No.: US 9,263,119 B2
(45) Date of Patent: Feb. 16, 2016

(54) SEMICONDUCTOR DEVICE HAVING MEMORY CELL WITH ELECTROSTATIC CAPACITANCE CIRCUIT

(71) Applicant: Renesas Electronics Corporation, Kawasaki (JP)

(72) Inventor: Hiroyuki Kobatake, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 215 days.

(21) Appl. No.: 13/922,773

(22) Filed: Jun. 20, 2013

(65) Prior Publication Data
US 2014/0010001 A1    Jan. 9, 2014

(30) Foreign Application Priority Data

Jul. 3, 2012  (JP) .................................. 2012-149505

(51) Int. Cl.
*G11C 11/41*    (2006.01)
*G11C 11/412*   (2006.01)
*G11C 11/419*   (2006.01)

(52) U.S. Cl.
CPC ............ *G11C 11/412* (2013.01); *G11C 11/419* (2013.01)

(58) Field of Classification Search
CPC ...... G11C 11/41; G11C 11/412; G11C 11/419
USPC ......... 365/149, 102, 154, 189.04, 189.2, 206, 365/156
See application file for complete search history.

(56) References Cited

U.S. PATENT DOCUMENTS

| | | | |
|---|---|---|---|
| 4,224,686 A * | 9/1980 | Aneshansley | ................. 365/154 |
| 4,590,508 A * | 5/1986 | Hirakawa et al. | ............. 257/379 |
| 6,535,417 B2 | 3/2003 | Tsuda et al. | |
| 7,474,583 B2 * | 1/2009 | Yamamura | .................... 365/226 |

OTHER PUBLICATIONS

S. M. Sze and Kwok K. NG, Physics of Semiconductor Devices, Oct. 2006, Wiley, Third Edition, Chapter 4. 44 pages.*

* cited by examiner

*Primary Examiner* — Thao-O H Bui
*Assistant Examiner* — Alfredo Bermudez Lozada
(74) *Attorney, Agent, or Firm* — Womble Carlyle Sandridge & Rice PLLC

(57) ABSTRACT

A capacitance coupled to a memory node and a word line of an SRAM cell provides an electrostatic capacitance between the memory node and the word line. The capacitance has a first electrostatic capacitance when the word line is in a non-selective state (usually a LOW level) and the memory node retains a HIGH level; the capacitance has a second electrostatic capacitance which is smaller than the first electrostatic capacitance when the word line is in the nonselective state (usually the LOW level) and the memory node retains the LOW level.

24 Claims, 16 Drawing Sheets

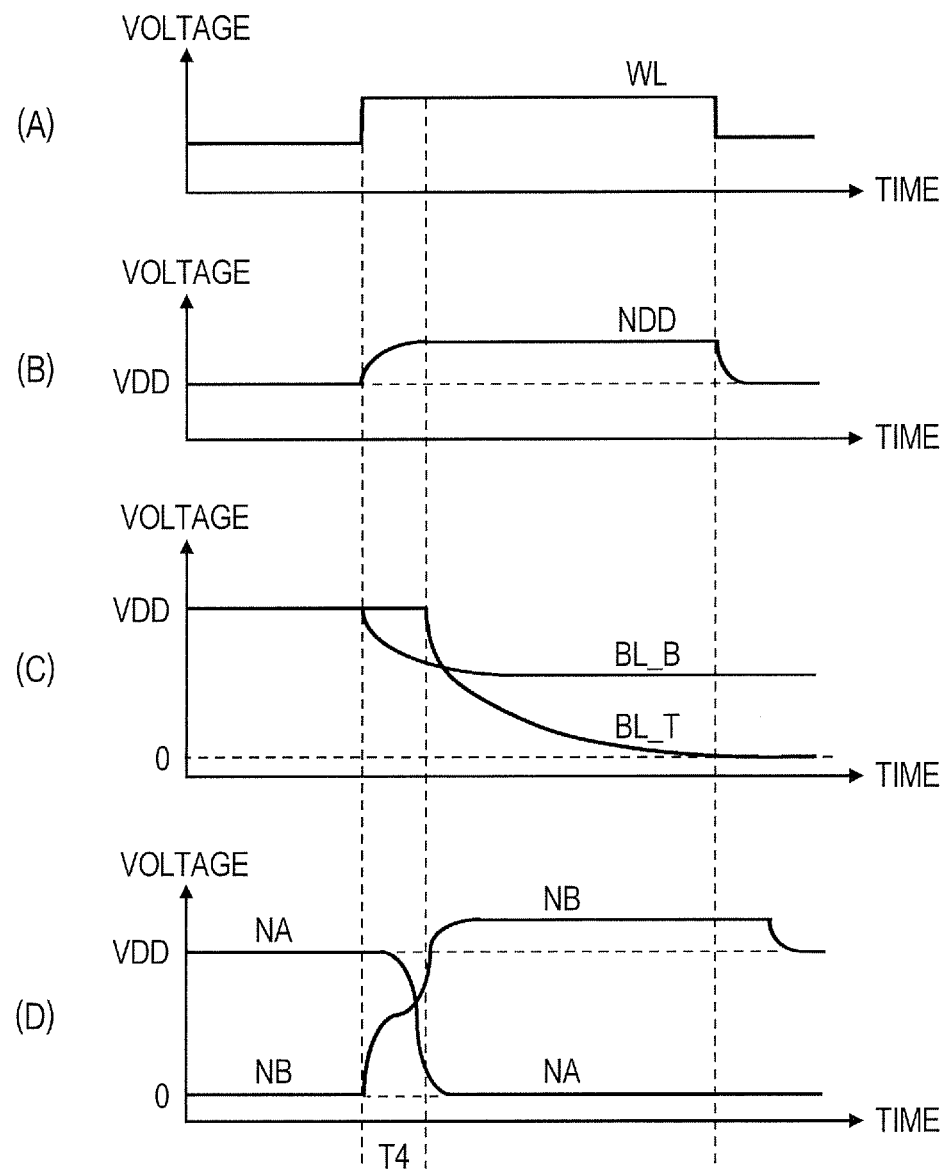

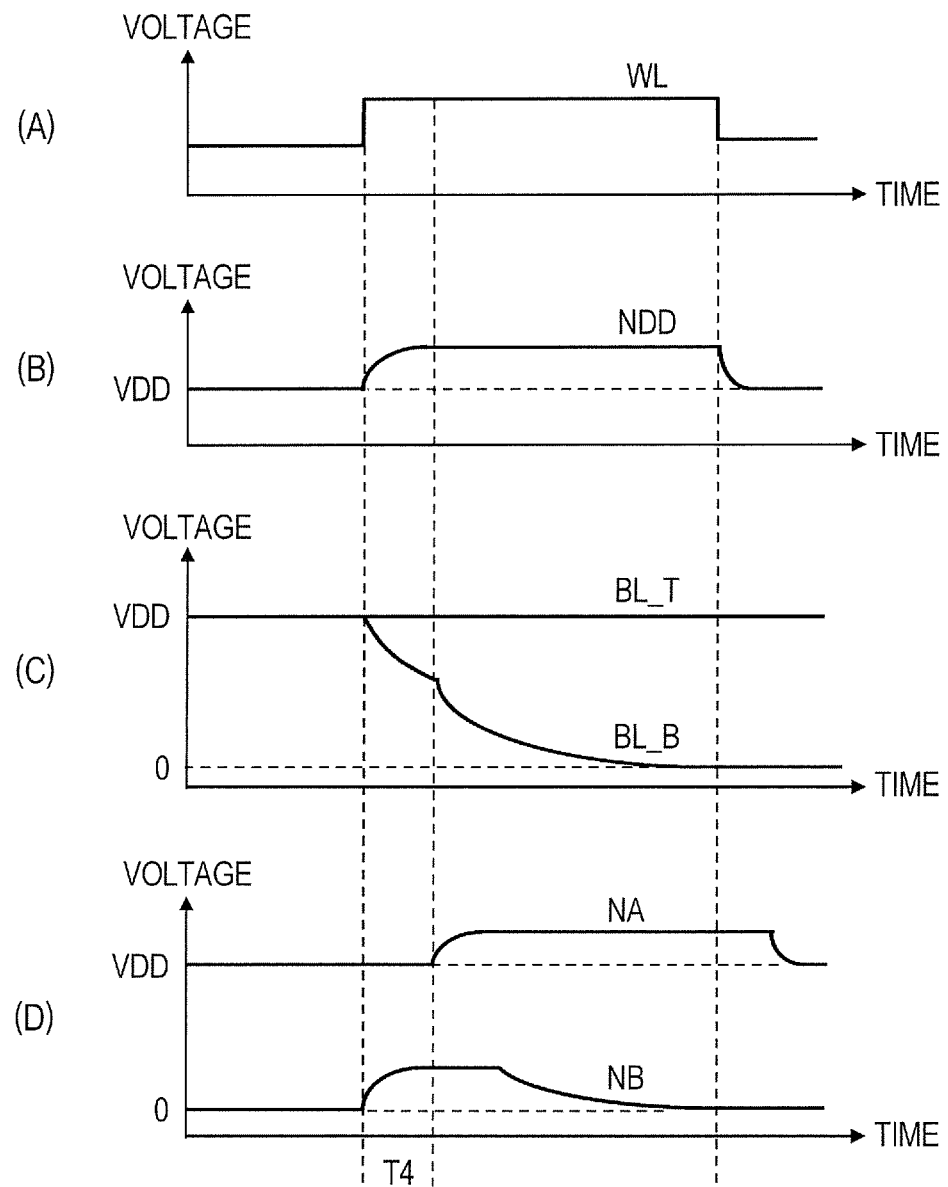

SEMICONDUCTOR DEVICE HAVING MEMORY CELL WITH ELECTROSTATIC CAPACITANCE CIRCUIT

CROSS-REFERENCE TO RELATED APPLICATIONS

The disclosure of Japanese Patent Application No. 2012-149505 filed on Jul. 3, 2012 including the specification, drawings and abstract is incorporated herein by reference in its entirety.

BACKGROUND

The present invention relates to a semiconductor device, in particular to a semiconductor memory device having SRAM (Static Random Access Memory) cells.

Patent Literature 1 discloses a technology for, when something is written to some of plural SRAM cells coupled to an identical word line, attaining simultaneously both the stabilization of write operation to the relevant SRAM cells and the speed-up of read operation and the prevention of malfunction in SRAM cells not subjected to writing (namely SRAM cells subjected to reading). FIG. 20 shows the configuration of an SRAM cell disclosed in Patent Literature 1 for attaining the above objects. An SRAM cell 900 shown in FIG. 20 has a pair of inverters constituting a flip-flop circuit. The inverter pair includes a first complementary metal oxide semiconductor (CMOS) inverter having transistors NM1 and PM1 and a second CMOS inverter having transistors NM2 and PM2.

Further, the SRAM cell 900 shown in FIG. 20 has a feed control switch P3 and a capacitive element C1. The feed control switch P3 is arranged between a feed node NDD of the inverter pair and a high reference voltage VDD. The feed control switch P3 is turned off when a word line WL is in a selective state (namely a HIGH potential) and disconnects the feed node NDD from the high reference voltage VDD. Meanwhile, the capacitive element C1 is arranged so as to have an electrostatic capacitance between the feed node and the word line WL. The capacitive element C1 raises the voltage of the feed node NDD disconnected from the high reference voltage VDD by the switch P3.

Data write operation to the SRAM cell 900 shown in FIG. 20 is as follows. That is, in a cell where rewriting is performed, the potential of the feed node NDD comes to be a level lower than the high reference voltage VDD when the word line WL is selected and the potential of the word line WL shifts from a LOW level to a HIGH level. As a result, bit inversion of the cell where the rewriting is performed is facilitated and the write margin improves. Meanwhile, in a cell, where rewriting is not performed, coupled to the word line WL identical to the cell subjected to rewriting, the potential of the feed node NDD is retained at a level higher than the high reference voltage VDD when the potential of the word line WL shifts from the LOW level to the HIGH level. As a result, bit inversion (namely data destruction) hardly occurs in the cell not subjected to rewriting.

Meanwhile, data read operation from the SRAM cell 900 shown in FIG. 20 is as follows. That is, in a cell where reading is performed, the potential of the feed node NDD of the inverter pair rises to a level higher than the high reference voltage VDD when the word line WL is selected and the potential of the word line WL shifts from the LOW level to the HIGH level. As a result, the voltage of a first memory node (here a memory node NA) retaining the HIGH level comes to be a level higher than the high reference voltage VDD and the drivability of a second drive transistor (NM2) to drive a second memory node (NB) retaining the LOW level improves. Consequently, the electricity charged in a bit line (BL_B) is discharged rapidly through a second transfer transistor (NM4) and the second drive transistor (NM2) and the potential rise of the second memory node (NB) of the LOW potential is suppressed. As a result, the SRAM cell 900 shown in FIG. 20 can improve an SNM (Static Noise Margin) during reading and can contribute to the increase of a read speed. In a non-read cell coupled to the word line WL identical to the cell subjected to reading too, the potential of the feed node NDD is retained at a level higher than the high reference voltage VDD. As a result, bit inversion (namely data destruction) of the non-read cell hardly occurs.

Patent Literature 2 discloses a configuration in which a MOS transistor operating as a capacitive element is coupled to a memory node of an SRAM cell. Specifically, the gate of the MOS transistor operating as a capacitive element is coupled to the memory node. Further, the source and drain of the MOS transistor operating as a capacitive element are coupled to a high reference voltage VDD, a low reference voltage (ground voltage GND), or the memory node. By such a configuration, the SRAM cell disclosed in Patent Literature 2 can add the electrostatic capacitance corresponding to the gate capacitance of the MOS transistor operating as a capacitive element to the memory node. As a result, the SRAM cell of Patent Literature 2 can contribute to the improvement of soft error resistance.

Patent Literature 1: Japanese Unexamined Patent Application Publication No. 2007-200520
Patent Literature 2: Japanese Unexamined Patent Application Publication No. 2002-050183

SUMMARY

The present inventors have found that an SRAM cell 900 shown in FIG. 20 has the following problems. That is, in an SRAM cell shown in FIG. 20, the potential of a feed node NDD of an inverter pair rises to a level higher than a high reference voltage VDD when the potential of a word line WL shifts from a LOW level to a HIGH level by the selection of the word line WL. A high voltage propagates from the feed node NDD to a first memory node NA retaining the HIGH level through a first load transistor (PM1) however and hence it takes a long time until the voltage of the first memory node NA rises. The reason is that the load transistor (PM1) constituting the SRAM cell is generally set at a high resistance. Consequently, it is concerned that the SRAM cell 900 shown in FIG. 20 can insufficiently suppress data inversion (data destruction) caused by a poor SNM occurring immediately after a word line WL is selected for reading. Further, in the SRAM cell 900 shown in FIG. 20, the drivability of a second drive transistor (NM2) does not improve until the voltage of the first memory node NA rises and hence it is estimated that the effect of increasing a read speed is small.

Here, Patent Literature 2 only discloses that a MOS transistor operating as a capacitive element is coupled to a memory node of an SRAM cell in order to improve soft error resistance. That is, the SRAM cell disclosed in Patent Literature 2 neither has the effect of increasing the voltage of a first memory node (NA) retaining a HIGH level when a word line WL shifts from a nonselective state (a LOW level) to a selective state (the HIGH level) nor can improve the drivability of a second drive transistor (NM2) to drive a second memory node (NB) retaining the LOW level. As a result, the disclosure of Patent Literature 2 does not contribute to the solution of the above problems which the SRAM cell 900 shown in FIG. 20 has.

A first aspect of the present invention includes a semiconductor device. The semiconductor device includes memory cells, first and second bit lines installed in correspondence to the memory cells, and word lines installed in correspondence to the memory cells. Each of the memory cells includes first and second memory nodes, a flip-flop circuit, first and second transfer transistors, and a first capacitive element. The flip-flop circuit sets either one of the first and second memory nodes at a first potential and the other one at a second potential which is lower than the first potential in response to stored data. The first transfer transistor controls the connection between the first memory node and the first bit line in response to whether the word line is in a selective state or in a nonselective state. The second transfer transistor controls the connection between the second memory node and the second bit line in response to whether the word line is in the selective state or in the nonselective state. The first capacitive element is coupled to the first memory node and the word line and has an electrostatic capacitance between the first memory node and the word line. Here, the first capacitive element has a first electrostatic capacitance when the word line is in the nonselective state and the first memory node has the first potential. Further, the first capacitive element has a second electrostatic capacitance which is smaller than the first electrostatic capacitance when the word line is in the nonselective state and the first memory node has the second potential.

In the first aspect, by the voltage rise effect of the first capacitive element, it is possible to raise the potential of the first memory node (NA) to a level higher than the first potential (the VDD level) immediately after the word line (WL) shifts from the nonselective state (for example the GND level) to the selective state (for example the VDD level) in order to read. Further, the first capacitive element has an electrostatic capacitance between the first memory node (NA) and the word line WL. As a result, in contrast with an SRAM cell of Patent Literature 1, in the first embodiment, it is possible to rapidly raise the potential of the first memory node (NA) without incurring delay caused by a load transistor (or resistance load) having a high resistance. Consequently, in the first embodiment, it is possible to rapidly perform the operation of raising the potential of the first memory node (NA) in response to the selection of the word line in comparison with an SRAM cell of Patent Literature 1. In the first embodiment therefore, it is possible to sufficiently suppress data inversion (data destruction) caused by a poor SNM during reading and contribute to the increase of a read speed in comparison with a device disclosed in Patent Literature 1.

According to a second aspect of the present invention, a semiconductor device includes memory cells, first and second bit lines installed in correspondence to the memory cells, and word lines installed in correspondence to the memory cells. Each of the memory cells includes first and second memory nodes, a flip-flop circuit, first and second transfer transistors, and a first capacitive element. The flip-flop circuit sets either one of the first and second memory nodes at a first potential and the other one at a second potential which is lower than the first potential in response to stored data. The first transfer transistor controls the connection between the first memory node and the first bit line in response to whether the word line is in a selective state or in a nonselective state. The second transfer transistor controls the connection between the second memory node and the second bit line in response to whether the word line is in the selective state or in the nonselective state. The first capacitive element has a MIS (Metal Insulator Semiconductor) structure, is coupled to the first memory node and the word line, and has an electrostatic capacitance between the first memory node and the word line.

Here, the MIS structure includes (a) a first conductivity type semiconductor region, (b) an insulation layer formed over the surface region of the first conductivity type semiconductor region, (c) a conductive layer formed over the insulation layer, and (d) a second conductivity type semiconductor region formed adjacently to the surface region. The conductive layer (c) is coupled to either one of the first memory node and the word line. The second conductivity type semiconductor region (d) is coupled to the other one of the first memory node and the word line.

The second aspect has the first capacitive element having an electrostatic capacitance between the first memory node (NA) and the word line WL in the same manner as the first embodiment. As a result, in the second embodiment, it is possible to rapidly perform the operation of further raising the potential of the first memory node (NA) retaining the first potential (the VDD level) in response to the selection of the word line in comparison with an SRAM cell of Patent Literature 1 in the same manner as the first embodiment of the present invention. In the second embodiment therefore, it is possible to sufficiently suppress data inversion (data destruction) caused by a poor SNM during reading and contribute to the increase of a read speed in comparison with a device disclosed in Patent Literature 1.

In the first and second aspects of the present invention stated above, it is possible to sufficiently suppress data inversion (data destruction) caused by a poor SNM during reading and contribute to the increase of a read speed.

BRIEF DESCRIPTION OF THE DRAWINGS

FIG. 21 is a timing chart on read operation of the SRAM cell shown in FIG. 20 in which bit inversion (data destruction) is caused (comparative example); and FIG. 22 is a timing chart on read operation of the SRAM cell shown in FIG. 20 in which bit inversion (data destruction) is not caused (comparative example).

DETAILED DESCRIPTION

Figure 1:
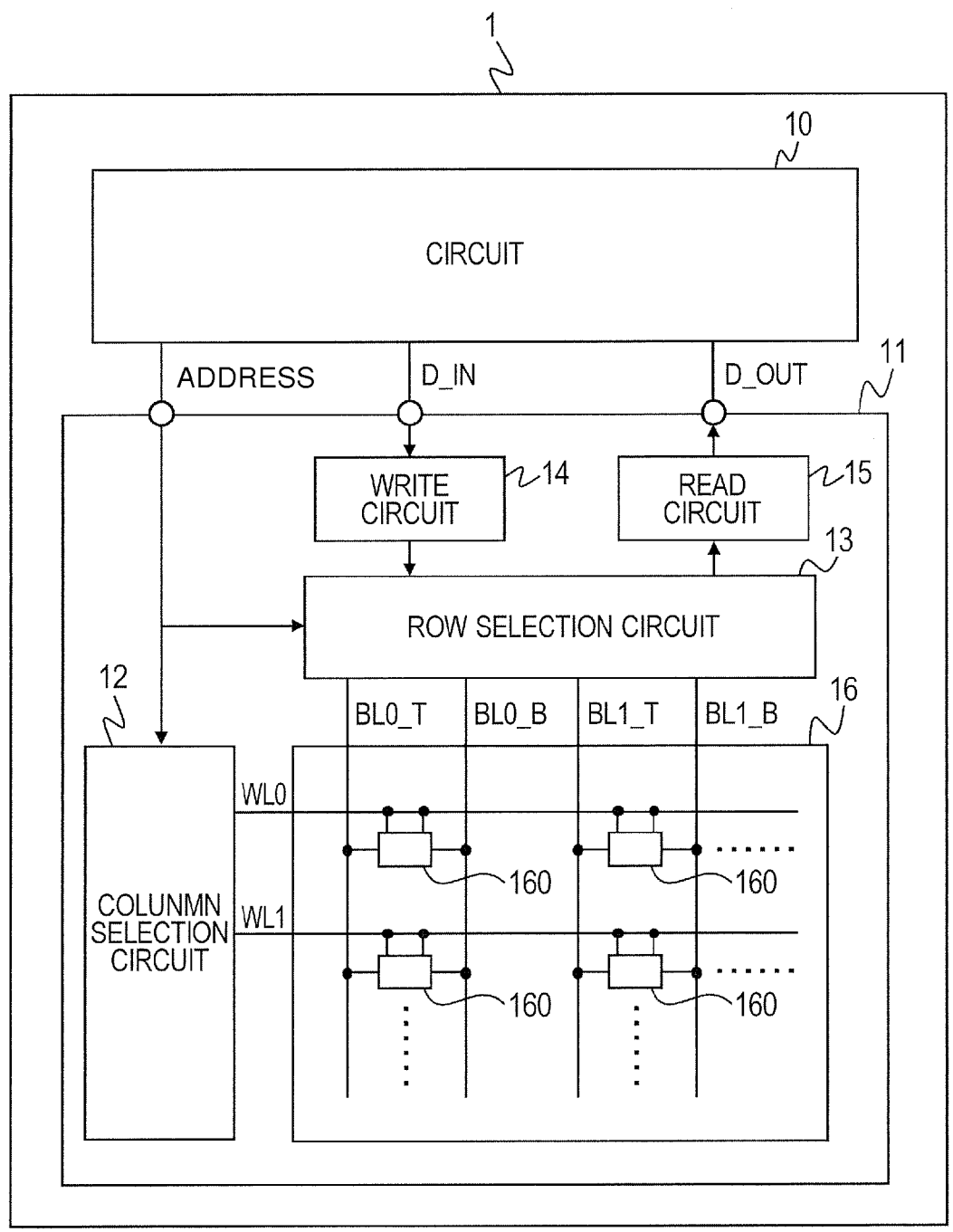
FIG. 1 is a block diagram showing a configuration example of a semiconductor device according to a first embodiment of the present invention.

Concrete embodiments to which the present invention is applied are hereunder explained in detail in reference to drawings. In the drawings, elements identical or corresponding to each other are represented by an identical symbol and duplicative explanations are omitted for clarification when needed.

First Embodiment

FIG. 1 is a block diagram showing a configuration example of a semiconductor device 1 according to the present embodiment. The semiconductor device 1 has a circuit 10 and an SRAM 11. The circuit 10 supplies an address signal to an address terminal of the SRAM 11, writes data to the SRAM 11, and reads data from the SRAM 11. The SRAM 11 receives write data from the circuit 10 through an input data terminal (D_IN). Further, the SRAM 11 supplies read data to the circuit 10 through an output data terminal (D_OUT). The semiconductor device 1 is a microprocessor such as a microcontroller, an MPU (Micro Processing Unit), a CPU (Central Processing Unit), a DSP (Digital Signal Processor) or the like for example. On this occasion, the SRAM 11 is an internal cache memory incorporated in a microprocessor.

The SRAM 11 includes an SRAM cell array 16 in which multiple memory cells (SRAM cells) 160 are arranged in a grid pattern, and peripheral circuits. A column selection circuit 12 decodes an address signal and selects a word line WL corresponding to a memory cell 160 assigned by the address signal from among multiple word lines (WL0, WL1, ... ). A row selection circuit 13 decodes an address signal and selects a pair of bit lines BL_T and BL_B corresponding to a memory cell 160 assigned by the address signal from among multiple bit line pairs (BL0_T and BL0_B, BL1_T and BL1_B, ... ). A write circuit 14 drives a pair of bit lines BL_T and BL_B corresponding to a cell 160 to be written and writes data to the cell 160. A read circuit 15 is coupled to a pair of bit lines BL_T and BL_B corresponding to a cell 160 to be read and detects and amplifies data retained in the cell 160.

Successively, the configuration of an SRAM cell 160 is hereunder explained in detail. An SRAM cell 160 has first and second memory nodes NA and NB, respectively, and stores data by a flip-flop circuit having bistability. A bistable type flip-flop circuit sets either one of the memory nodes NA and NB at a HIGH level and the other one at a LOW level in response to data to be stored. Generally a bistable type flip-flop circuit comprises a positive feedback loop circuit using two inverters. In other words, a bistable type flip-flop circuit comprises two inverters (NOT gates) cross-connected to each other.

Figure 2:
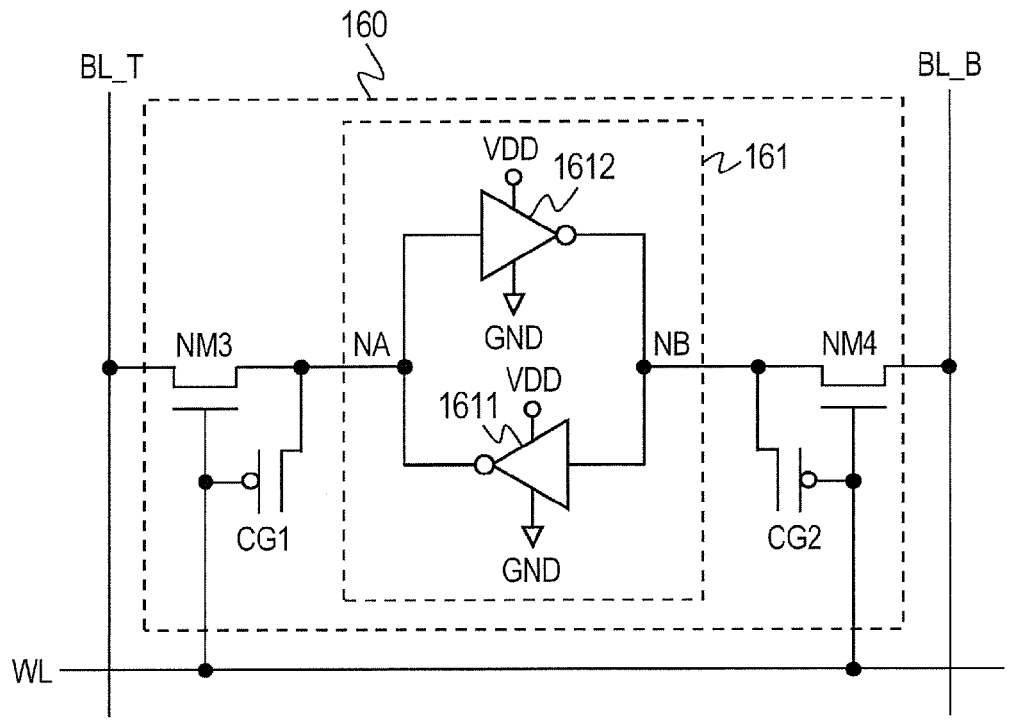
FIG. 2 is a circuit diagram showing a first configuration example of an SRAM cell included in the semiconductor device shown in FIG. 1.
Figure 3:
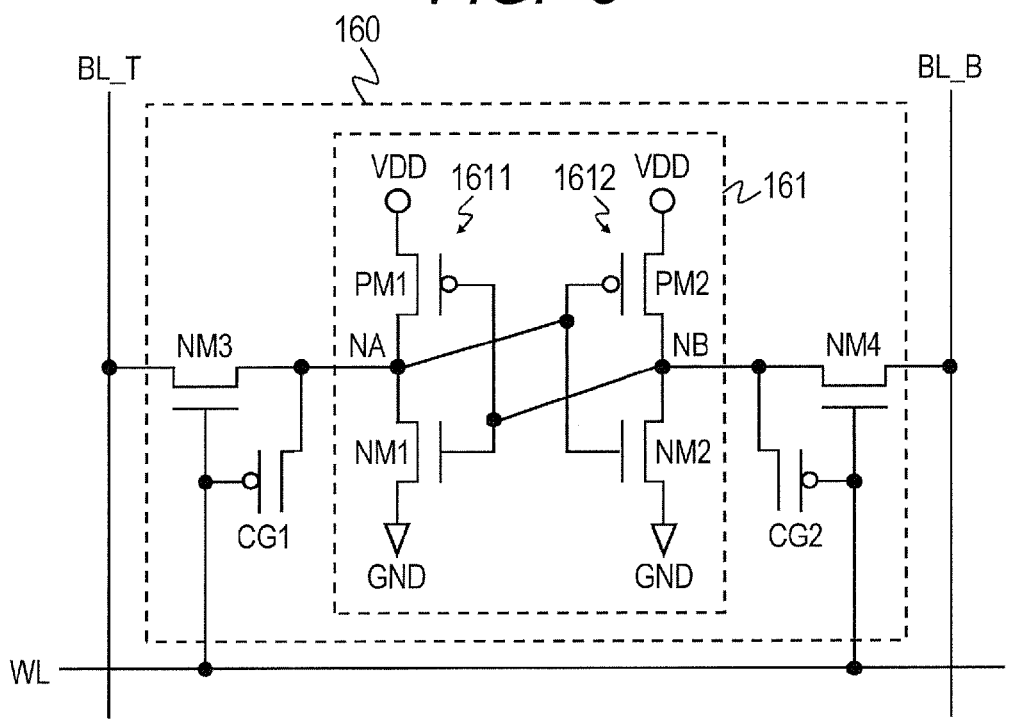
FIG. 3 is a circuit diagram showing a second configuration example of an SRAM cell included in the semiconductor device shown in FIG. 1.
Figure 4:
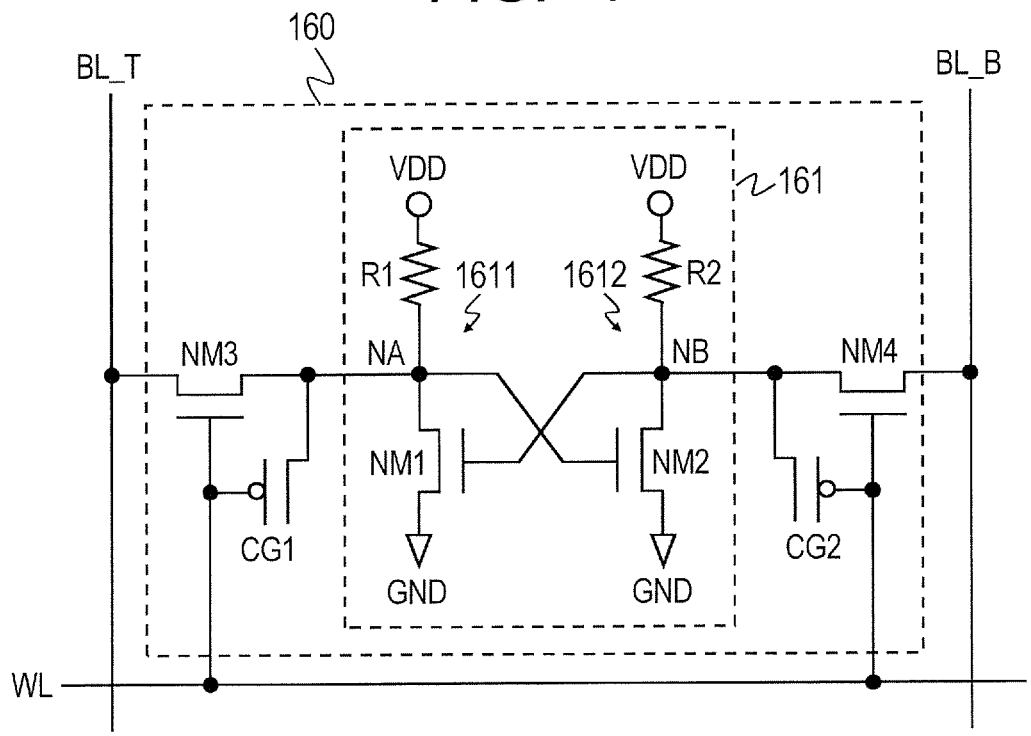
FIG. 4 is a circuit diagram showing a third configuration example of an SRAM cell included in the semiconductor device shown in FIG. 1.

FIGS. 2 to 4 are circuit diagrams showing first to third configuration examples of an SRAM cell 160. The first configuration example shown in FIG. 2 has a flip-flop circuit 161 including a positive feedback loop using first and second inverters 1611 and 1612, respectively. In the first inverter 1611, an input terminal is coupled to a second memory node NB and an output terminal is coupled to a first memory node NA. In the second inverter 1612 in contrast, an input terminal is coupled to the first memory node NA and an output terminal is coupled to the second memory node NB.

The connection between a pair of bit lines BL_T and BL_B and the memory nodes NA and NB is controlled by first and second transfer transistors (transfer gates) NM3 and NM4, respectively. The transfer transistors NM3 and NM4 are NMOS transistors. The gates of the transfer transistors NM3 and NM4 are coupled to a word line WL. One of the source and the drain of the first transfer transistor NM3 is coupled to the bit line BL_T and the other is coupled to the first memory node NA. One of the source and the drain of the second transfer transistor NM4 is coupled to the bit line BL_B and the other is coupled to the second memory node NB. That is, the transfer transistors NM3 and NM4 control the connection between the memory nodes NA and NB and a pair of bit lines BL_T and BL_B in response to whether a word line WL corresponding to the relevant cell 160 is in a selective state (a HIGH level) or in a nonselective state (a LOW level).

FIG. 3 shows an example of configuring a flip-flop circuit 161 by using field-effect transistors. Specifically, the second configuration example shown in FIG. 3 shows an SRAM cell 160 of a CMOS inverter type. In FIG. 3, a first inverter 1611 has a first PMOS load transistor PM1 and a first NMOS drive transistor NM1 coupled in series between a high reference voltage (VDD) and a low reference voltage (GND). The gates of the transistors PM1 and NM1 are coupled to a second memory node NB. The drains of the transistors PM1 and NM1 are coupled to a first memory node NA. A second inverter 1612 has a second PMOS load transistor PM2 and a second NMOS transistor load NM2 coupled in series between a high reference voltage (VDD) and a low reference voltage (GND). The gates of the transistors PM2 and NM2 are coupled to the first memory node NA. The drains of the transistors PM2 and NM2 are coupled to the second memory node NB.

FIG. 4 also shows an example of configuring a flip-flop circuit 161 by using field-effect transistors. Specifically, the third configuration example shown in FIG. 4 shows an SRAM cell 160 of a resistance load type. In FIG. 4, a first inverter 1611 has a first drive transistor NM1 to drive a first memory node NA and a first resistance load R1. The first drive transistor NM1 is an NMOS transistor the gate of which is coupled to a second memory node NB and the drain thereof is coupled to the first memory node NA. A second inverter 1612 has a second drive transistor NM2 to drive the second memory node NB and a second resistance load R2. The second drive transistor NM2 is an NMOS transistor the gate of which is coupled to the first memory node NA and the drain thereof is coupled to the second memory node NB.

An SRAM cell 160 according to the present embodiment has capacitances CG1 and CG2 coupled between a word line WL and memory nodes NA and NB as shown in FIGS. 2 to 4. The first capacitance CG1 has an electrostatic capacitance between the word line WL and the first memory node NA. The second capacitance CG2 has an electrostatic capacitance between the word line WL and the second memory node NB. In the cases of FIGS. 2 to 4, each of the capacitances CG1 and CG2 is structured as a MIS (Metal Insulator Semiconductor) capacitance using a P-channel (P-type inversion layer). The MIS capacitance is a variable-capacitance element that makes use of the fact that an electrostatic capacitance between a gate electrode and a semiconductor region (semiconductor substrate or well) opposing the gate electrode through a gate oxide film (insulation layer) varies in response to a gate voltage. The capacitances CG1 and CG2 that are P-channel type MIS capacitances may have a structure similar to a PMOS transistor, namely a structure having two $P^+$ diffusion regions corresponding to a source and a drain. Further, the capacitances CG1 and CG2 may also have a structure having only one of two $P^+$ diffusion regions corresponding to a source and a drain of a PMOS transistor. In a P-channel type MIS capacitance too, an N-type semiconductor region (substrate or well) is coupled to a high reference voltage VDD so that the interface between a $P^+$ diffusion region and the N-type semiconductor region (substrate or well of an N-type) may have a reverse bias.

Figure 5:
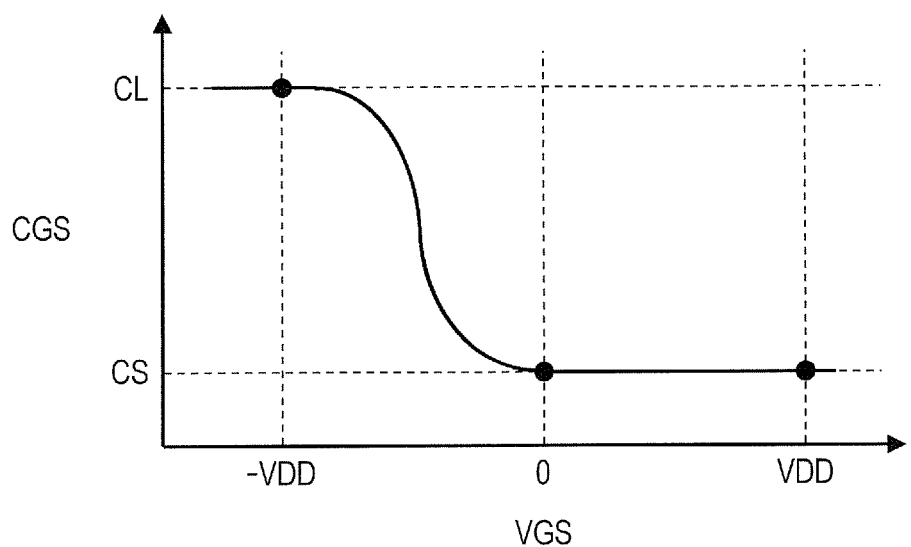
FIG. 5 is a graph showing the relationship between a gate-to-source voltage VGS and a gate-to-source electrostatic capacitance CGS in a P-channel type MIS capacitance shown in FIGS. 2 to 4.

In a P-channel type MIS capacitance, an electrostatic capacitance CGS is varied in response to a gate-to-source voltage VGS. FIG. 5 is a graph showing the relationship between a gate-to-source voltage VGS and a gate-to-source electrostatic capacitance CGS in each of the capacitances CG1 and CG2 that are P-channel type MIS capacitances. As shown in FIG. 5, when VGS is −VDD, namely a gate is at a LOW (GND) level and a source is at a HIGH (VDD) level, each of the capacitances CG1 and CG2 has a relatively large electrostatic capacitance CL. This is because, since the gate potential is sufficiently lower than the potential (VDD) of an N-type semiconductor region (substrate or well), a P-channel (P-type inversion layer) is formed and the potential of the P-type inversion layer is identical to the potential (VDD) of the source. On this occasion, the P-type inversion layer is electrically coupled to the source, only the electrostatic capacitance of a gate oxide film exists between the gate and the source, and the electrostatic capacitance CGS between the gate and the source takes a relatively large value CL.

When VGS is zero or higher in contrast, each of the capacitances CG1 and CG2 has a relatively small electrostatic capacitance CS. When each of the gates of the capacitances CG1 and CG2 is at a LOW (GND) level and each of the sources is also at the LOW (GND) level for example, although a P-type inversion layer is formed by potential difference between the gate and an N-type semiconductor region (substrate or well), the P-type inversion layer takes the GND potential at the moment when the P-type inversion layer is coupled to the source of the LOW (GND) level. On this occasion, the gate also has the GND potential and hence the P-type inversion layer disappears (the P-type inversion layer cannot exist). Consequently, the electrostatic capacitance of the gate oxide film that has existed between the gate and the source disappears and the electrostatic capacitance CGS between the gate and the source takes a relatively small value CS.

Further, when each of the gates of the capacitances CG1 and CG2 is at the HIGH (VDD) level, the gate and the N-type semiconductor region (substrate or well) have a substantially identical potential. Consequently, the P-type inversion layer is not formed. The source of the HIGH (VDD) level or the LOW (GND) level is electrically separated (zero or reverse bias) from the N-type semiconductor region (substrate or well) and hence the electrostatic capacitance CGS between the gate and the source takes a relatively small value CS.

In FIGS. 2 to 4, in the first capacitance CG1, the gate is coupled to the word line WL and the source is coupled to the first memory node NA. Likewise, in the second capacitance CG2, the gate is coupled to the word line WL and the source is coupled to the second memory node NB. When each of the capacitances CG1 and CG2 has a structure including two $P^+$ diffusion regions, namely a source and a drain, in the same manner as a P-channel transistor, both the source and the drain may be coupled to the memory node NA or NB. The first capacitance CG1 coupled in this way varies the electrostatic capacitance CGS between the word line WL and the memory first node NA as follows in response to the selective state of the word line WL and the voltage retained in the first memory node NA. The same goes for the second capacitance CG2.

(1) When the word line is in a nonselective state (LOW (GND) level) and the first memory node NA is at a HIGH (VDD) level, the gate-to-source voltage VGS is biased to −VDD. Consequently, the first capacitance CG1 has a relatively large electrostatic capacitance CL.

(2) When the word line is in a nonselective state (LOW (GND) level) and the first memory node NA is at the LOW (GND) level, the gate-to-source voltage VGS is biased to 0 V. Consequently, the first capacitance CG1 has a relatively small electrostatic capacitance CS.

(3) When the word line is in a selective state (HIGH (VDD) level), the gate-to-source voltage VGS is biased to 0 V or +VDD. Consequently, the first capacitance CG1 has a relatively small electrostatic capacitance CS regardless of whether the first memory node NA is at the HIGH (VDD) level or at a LOW (GND) level.

Figure 6:
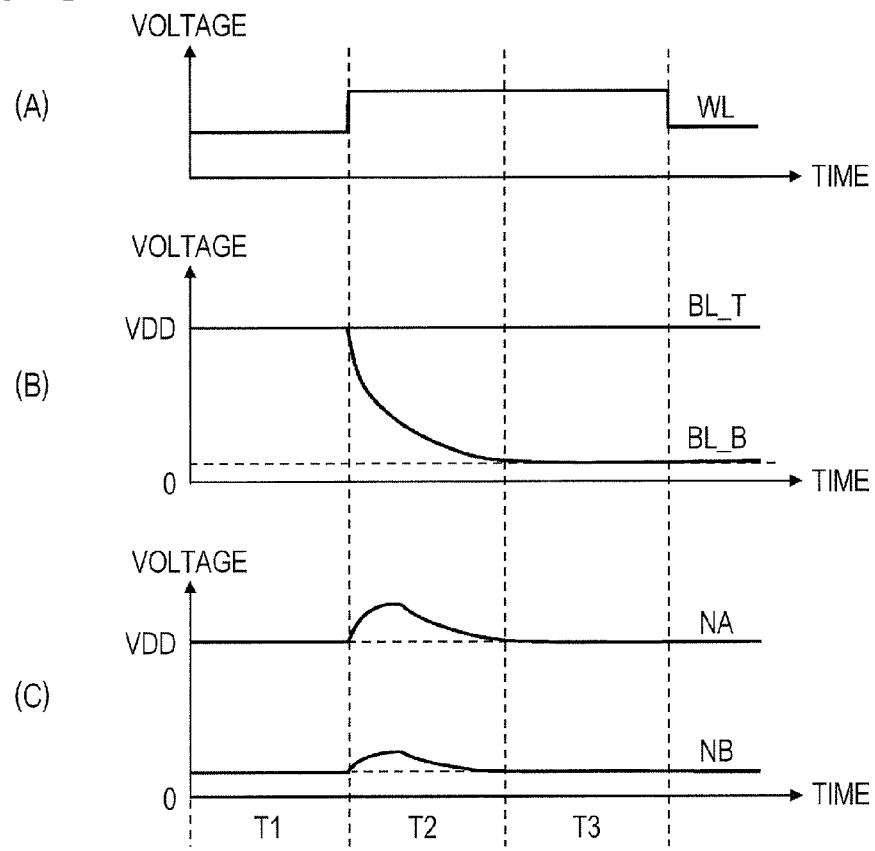
FIG. 6 is a timing chart on read operation of the SRAM cell shown in FIG. 3 or 4.

Successively, read operation of an SRAM cell 160 is hereunder explained in reference to the timing chart shown in FIG. 6. FIG. 6 is a timing chart for the configuration example shown in FIG. 3 or 4 and shows the read operation of the SRAM cell 160 when the first memory node NA stores the HIGH level and the second memory node NB stores the LOW level. Chart 6(A) in FIG. 6 shows the potential of the word line WL. Chart 6(B) in FIG. 6 shows the potentials of the bit lines BL_T and BL_B. Chart 6(C) in FIG. 6 shows the potentials of the memory nodes NA and NB.

During the period when the word line WL is in a nonselective state (LOW level) (the period T1 in FIG. 6), the first capacitance CG1 coupled to the word line WL and the first memory node NA has the electrostatic capacitance CL that is larger than that of the second capacitance CG2. During the period T1, the second capacitance CG2 coupled to the word line WL and the second memory node NB in contrast has the electrostatic capacitance CS which is relatively smaller than that of the first capacitance CG1. Consequently, when the word line WL shifts from the nonselective state (LOW level) to a selective sate (HIGH level) (the period T2 in FIG. 6), the potential of the first memory node NA is raised to a level higher than the HIGH (VDD) level by the electric charge retained in the first capacitance CG1 having the large electrostatic capacitance CL. Here, the second capacitance CG2 only has the relatively small electrostatic capacitance CS, hence the potential rise of the second memory node NB retaining the LOW level is suppressed so as to be smaller (see chart 6(C)), and thus bit inversion is not caused.

The first memory node NA raised to a value higher than the HIGH (VDD) level is coupled to the gate of the second drive transistor NM2 to drive the second memory node NB as shown in FIGS. 3 and 4. Consequently, the drivability of the second drive transistor NM2 improves in comparison with the case of operating by VDD. As a result, the electricity charged in the bit line (BL_B) is discharged rapidly through the second transfer transistor (NM4) and the second drive transistor (NM2) and thereby the potential rise of the second memory node NB retaining the LOW potential is suppressed. By suppressing the potential rise of the second memory node NB to a level lower than the gate threshold voltage of the transistors (PM1 and NM1 in the circuit of FIG. 3, and NM1 in the circuit of FIG. 4) constituting the inverter 1611, the data inversion (data destruction) of the memory nodes NA and NB is suppressed. As a result, the SRAM cell 160 can improve an SNM during reading and can contribute to the increase of a read speed.

Further, an SRAM cell 160 according to the present embodiment includes the first capacitance CG1 having an electrostatic capacitance between the first memory node NA and the word line WL. As a result, the SRAM cell 160 can rapidly raise the potential of the first memory node NA retaining a HIGH level without incurring delay caused by the load transistor PM1 (or resistance load R1) having a high resistance in contrast to an SRAM cell of Patent Literature 1. That is, as shown in the period T2 of FIG. 6, it is possible to rapidly raise the potential of the first memory node NA retaining the HIGH level in response to the shift of the word line WL to a selective state. As a result, in the present embodiment, it is possible to sufficiently suppress data inversion (data destruction) caused by a poor SNM during reading and contribute to the increase of a read speed.

Here, when the word line WL is in the selective state (HIGH level), the potential of the memory node NA is returned to VDD by the first load transistor PM1 of FIG. 3 (or first resistance load R1 in the case of FIG. 4) that is in the on-state. The first load transistor PM1 (or first resistance load R1) constituting the SRAM cell 160 however is generally set at a high resistance. Consequently, the potential rise period (T2) of the first memory node NA immediately after the word line WL is selected is secured. In other words, the rise of the potential of the first memory node NA is limited to a certain period of time after the word line WL is selected and is not obtained over the whole period (the periods T2 and T3 in FIG. 6) when the word line WL is in the selective state (HIGH level). The inversion of memory data (data destruction) and the discharge of a bit line in the SRAM cell 160 however are operations occurring immediately after the word line WL is selected. Consequently, this does not excessively hinder the effect of suppressing data inversion and the effect of increasing the discharge speed (read speed) of a bit line. Inversely, as shown in the period T3 of FIG. 6, by lowering the potential of the first memory node NA storing the HIGH level to VDD at the latter half of the selection period of the word line WL, it is possible to mitigate the deterioration of reliability caused by the continuous overdrive of the second drive transistor NM2.

Successively, the case where the word line shifts from the selective state (HIGH level) to the nonselective state (LOW level) is explained hereunder. While the word line is in the selective state (HIGH level) (the periods T2 and T3 in FIG. 6), both the capacitances CG1 and CG2 have the small electrostatic capacitance CS. Consequently, the operation of the SRAM cell 160 when the word line WL shifts to the nonselective state (LOW level) is substantially identical to the operation of an ordinary SRAM cell in which no capacitances CG1 and CG2 are installed.

Here, read operation of an SRAM cell (SRAM cell 900 in FIG. 20) disclosed in Patent Literature 1 is explained for comparison with the SRAM cell 160. FIG. 21 shows the read operation of the SRAM cell 900 in the case where a memory node NA stores a HIGH level and a memory node NB stores a LOW level. Here, FIG. 21 shows the case where bit inversion (data destruction) of the memory nodes NA and NB is caused. As stated earlier, in the SRAM cell 900 of FIG. 20, a high voltage propagates from a feed node NDD to the first memory node NA through a first load transistor (PM1). As a result, as shown in FIG. 21(D), the voltage of the first memory node NA rises insufficiently during the initial timing (period T4) immediately after a word line WL shifts from a nonselective state (the LOW level) to a selective state (the HIGH level). Consequently, the electricity charged in a bit line BL_B is discharged insufficiently, the potential of the second memory node NB retaining the LOW level rises, and, in the worst case, bit inversion is caused in the memory nodes NA and NB.

FIG. 22 also shows read operation of an SRAM cell 900 in the case where a memory node NA stores a HIGH level and a memory node NB stores a LOW level. FIG. 22 however shows the case where bit inversion (data destruction) of the memory nodes NA and NB is not caused. In this case too, as shown in FIG. 22(D), the voltage of the memory node NA rises insufficiently during the timing (period T4) immediately after a word line WL shifts from a nonselective state (the LOW level) to a selective state (the HIGH level). Consequently, the electricity charged in a bit line BL_B is discharged insufficiently and the effect of increasing a read speed is small.

Figure 20:
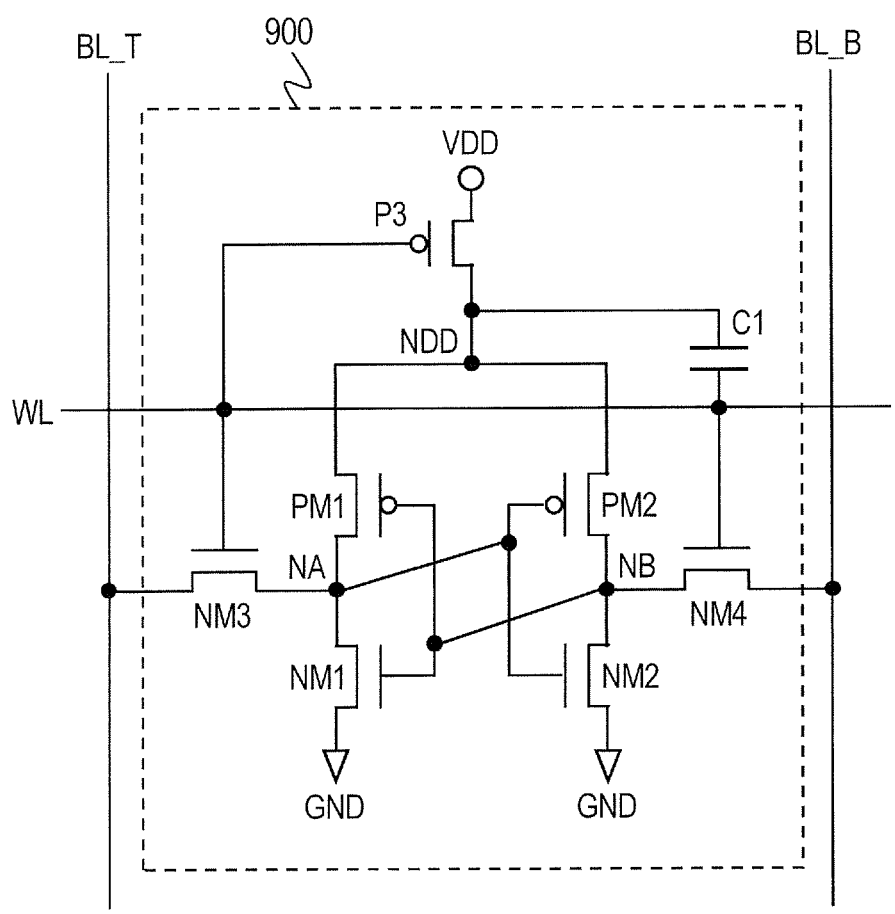
FIG. 20 is a circuit diagram showing a configuration example of an SRAM cell according to Background (comparative example)

As it is obvious from comparison between FIG. 6 and FIGS. 21 and 22 (especially charts 6(C) and charts 21(D) and 22(D)), the SRAM cell 160 according to the present embodiment can rapidly raise the potential of the memory node NA immediately after the word line WL shifts to the selective state (HIGH level) in comparison with the SRAM cell 900 in FIG. 20. Consequently, the SRAM cell 160 according to the present embodiment can sufficiently suppress data inversion (data destruction) caused by a poor SNM during reading and can contribute to the further increase of a read speed in comparison with the SRAM cell 900 in FIG. 20.

Additionally, in the SRAM cell 900 in FIG. 20, the capacitive element C1 is not coupled to the memory nodes NA and NB. Consequently, the SRAM cell 900 in FIG. 20 does not contribute to the improvement of soft error resistance that comes to be conspicuous with the miniaturization of the semiconductor production process and the trend of constant voltage. In contrast, the SRAM cell 160 according to the present embodiment has the capacitances CG1 and CG2 coupled to the memory nodes NA and NB and hence can improve the soft error resistance.

Figure 7:
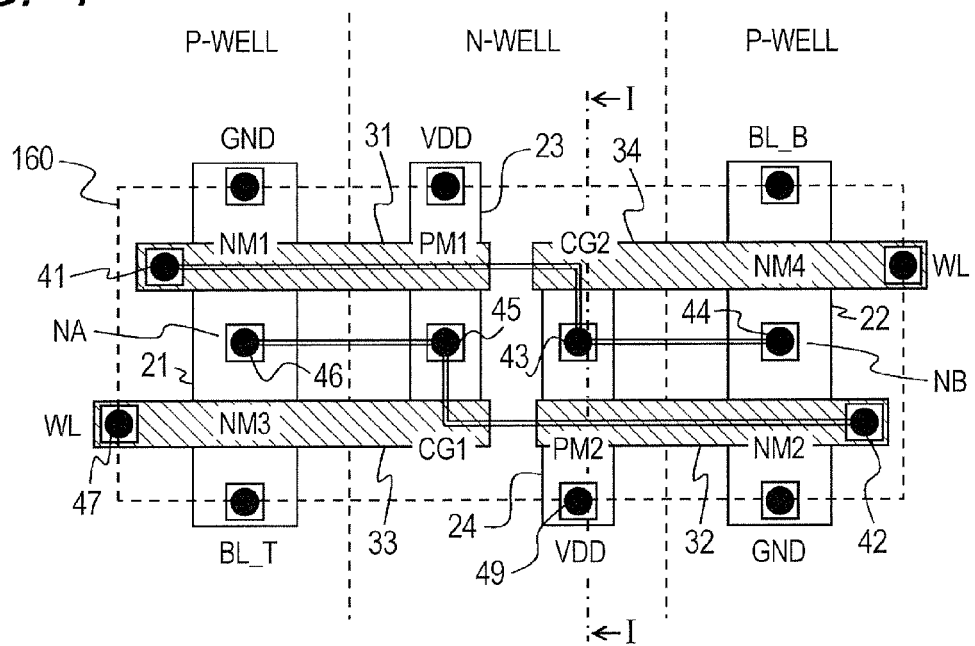
FIG. 7 is a plan view showing an example of a circuit layout of the SRAM cell shown in FIG. 3.
Figure 8:
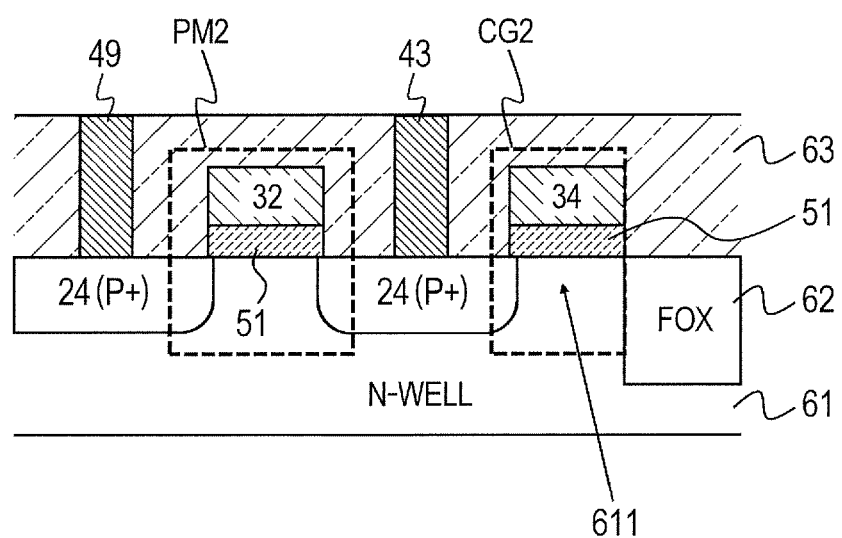
FIG. 8 is a sectional view taken on line I-I shown in FIG. 7.

Successively, the layout of an SRAM cell 160 according to the present embodiment is explained hereunder. FIG. 7 is a layout view (plan view) showing a concrete example of element arrangement over a semiconductor substrate, of the SRAM cell 160 shown in FIG. 3. FIG. 8 shows a sectional view taken on line I-I of FIG. 7. The configuration example of the SRAM 160 shown in FIG. 3 has a bilaterally symmetrical structure including capacitances CG1 and CG2 and hence, as shown in FIG. 7, an element arrangement having a high degree of symmetry can be adopted. An element arrangement having a high degree of symmetry is effective in facilitating space-saving by sharing a diffusion region among adjacent cells and contributing to the prevention of the increase of a chip area.

In the layout shown in FIG. 7, two P-wells and one N-well are formed in a semiconductor substrate. Here, it is also possible that P-wells are not formed and a semiconductor substrate of a P type is used for example. In the two P-wells, first and second N⁺ diffusion regions 21 and 22, respectively, the circumferences of which are surrounded by a field oxide film (interelement separating layer) are formed. Further, in the N-well, first and second P⁺ diffusion regions 23 and 24, respectively, the circumferences of which are surrounded by a field oxide film (interelement separating layer) are formed.

A first polysilicon wiring (conductive layer) 31 is formed in the manner of straddling the first N⁺ diffusion region 21 and the first P⁺ diffusion region 23 and used as a common gate electrode of a CMOS inverter 1611 comprising transistors NM1 and PM1. Likewise, a second polysilicon wiring (conductive layer) 32 is formed in the manner of straddling the second N⁺ diffusion region 22 and the second P⁺ diffusion region 24 and used as a common gate electrode of a CMOS inverter 1612 comprising transistors NM2 and PM2. It is understood that the first and second polysilicon wirings 31, 32 are simultaneously formed during the manufacturing process.

The double lines connecting contacts to contacts shown in FIG. 7 schematically show wires formed in a wiring layer as an upper layer. For example, the first polysilicon wiring 31 (namely the gates of the transistors NM1 and PM1) is coupled to a second memory node NB (namely the drains of the transistors NM2 and PM2) through contacts 41, 43, and 44. Then, the second polysilicon wiring 32 (namely the gates of the transistors NM2 and PM2) is coupled to a first memory node NA (namely the drains of the transistors NM1 and PM1) through contacts 42, 45, and 46.

Successively, the structure of capacitances CG1 and CG2 as P-channel type MIS capacitances is explained. In order to form the first capacitance CG1, the diffusion region (P⁺ diffusion region 23) on the drain side of the PMOS transistor PM1 extends downward in FIG. 7. A third polysilicon wiring (conductive layer) 33 is formed in the manner of straddling the first N⁺ diffusion region 21 and the first P⁺ diffusion region 23 and coupled to a word line WL through a contact 47. That is, the third polysilicon wiring 33 functions as the gate electrode of a first transfer transistor NM3 and also functions as the gate electrode of the first capacitance CG1. In this way, the first capacitance CG1 is formed by overlapping the third polysilicon wiring 33 and the first P⁺ diffusion region 23. Likewise, the second capacitance CG2 is formed by overlapping a fourth polysilicon wiring 34 and the second P⁺ diffusion region 24.

Here, in the example of FIG. 7, the contact 41 is arranged at the left end of the gate poly (first polysilicon wiring 31) of the transistors NM1 and PM1 in order to secure a space for forming the second capacitance CG2. Likewise, the contact 42 is arranged at the right end of the gate poly (second polysilicon wiring 32) of the transistors NM2 and PM2 in order to secure a space for forming the first capacitance CG1. The contact 41 however may also be formed over a gate poly (first polysilicon wiring 31) between NM1 and PM1. Likewise, the contact 42 may also be formed over a gate poly (second polysilicon wiring 32) between NM2 and PM2.

As seen in the plan view layout of FIG. 7, the first and second polysilicon wirings 31, 32 extend in a common first direction of the memory cell and are parallel to one another but do not overlap in a second direction which is orthogonal to the first direction. The third and fourth polysilicon wirings 33, 34 likewise extend in a common first direction of the memory cell and are parallel to one another but do not overlap in the second direction. Also, the first and fourth polysilicon wirings 31, 34 are collinear, and the second and third polysilicon wirings 32 33 are likewise collinear.

FIG. 8 is a sectional view of the region where the second load transistor PM2 and the P-channel type second capacitance CG2 are formed. The cross-section structure of the P-channel type first capacitance CG1 is the same as that of the second capacitance CG2 in FIG. 8. The capacitance CG2 comprises a gate electrode (fourth polysilicon wiring 34), a gate oxide film (insulation layer) 51, an N-type semiconductor region (N-well 61), and a second P⁺ diffusion region 24 adjacent to the N-type semiconductor region. The N-type semiconductor region (N-well 61) is coupled to a high reference voltage VDD although it is not shown in the figure. A contact 49 is formed over a second P⁺ diffusion region 24 used as the source of the second load PMOS transistor PM2 and electrically couples the source of transistor PM2 to at least one wiring layer in an upper layer. An interlayer insulation film 63 insulates a semiconductor substrate from a wiring layer in an upper layer (not shown in the figure). Here, in the example of FIGS. 7 and 8, the second capacitance CG2 has the second P⁺ diffusion region 24 corresponding to a source but does not have a P⁺ diffusion region corresponding to a drain. That is, a field oxide film 62 is formed in a region where a drain is formed in the case of a PMOS transistor.

More specifically, the MIS structure of the second capacitance CG2 includes the N-type semiconductor region (N-well 61), the insulation layer (gate oxide film 51) formed over a surface region (611) of the N-type semiconductor region (N-well 61), the conductive layer (fourth polysilicon wiring 34) formed over the insulation layer (gate oxide film 51), and a second conductivity type semiconductor region (second P⁺ diffusion region 24) formed adjacently to the surface region of the N-type semiconductor region (N-well 61). Then the conductive layer (fourth polysilicon wiring 34) is coupled to a word line WL. Further, the second conductivity type semiconductor region (second P⁺ diffusion region 24) is coupled to a second memory node NB.

Figure 9:
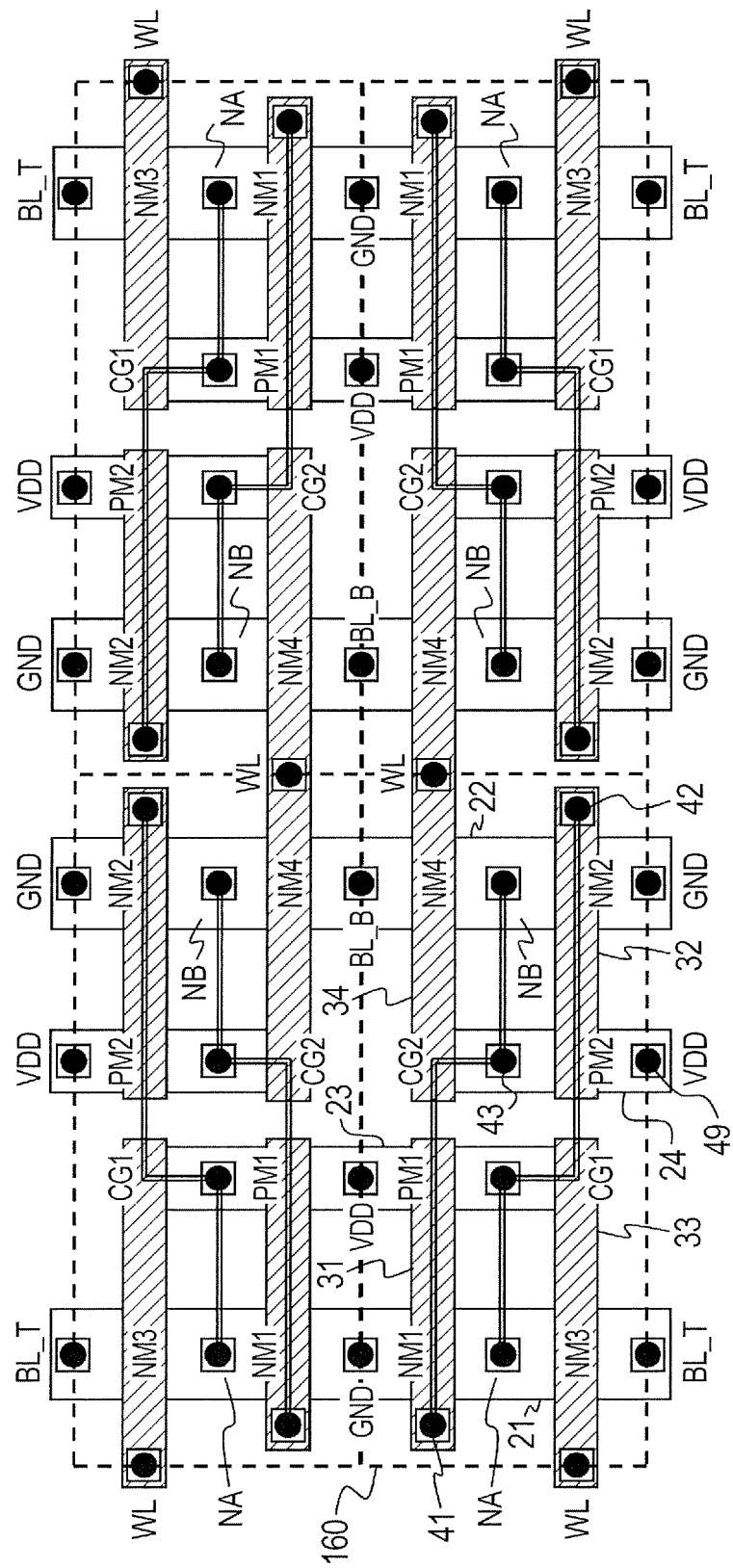
FIG. 9 is a plan view showing an example of a circuit layout of a cell array including the SRAM cell shown in FIG. 7.

FIG. 9 is a plan view showing the layout of a cell array in which multiple SRAM cells 160 one of which is shown in FIG. 8 are arranged. In the example of FIG. 9, diffusion regions 21 to 24 are shared among adjacent cells in the vertical direction by using the symmetry of element arrangement in a memory cell. That is, the sources of NMOS transistors NM1 to NM4 are shared with the sources of NM1 to NM4 of adjacent cells. Further, the sources of PMOS transistors PM1 and PM2 are shared with the sources of PMOS transistors PM1 and PM2 of adjacent cells.

Figure 10:
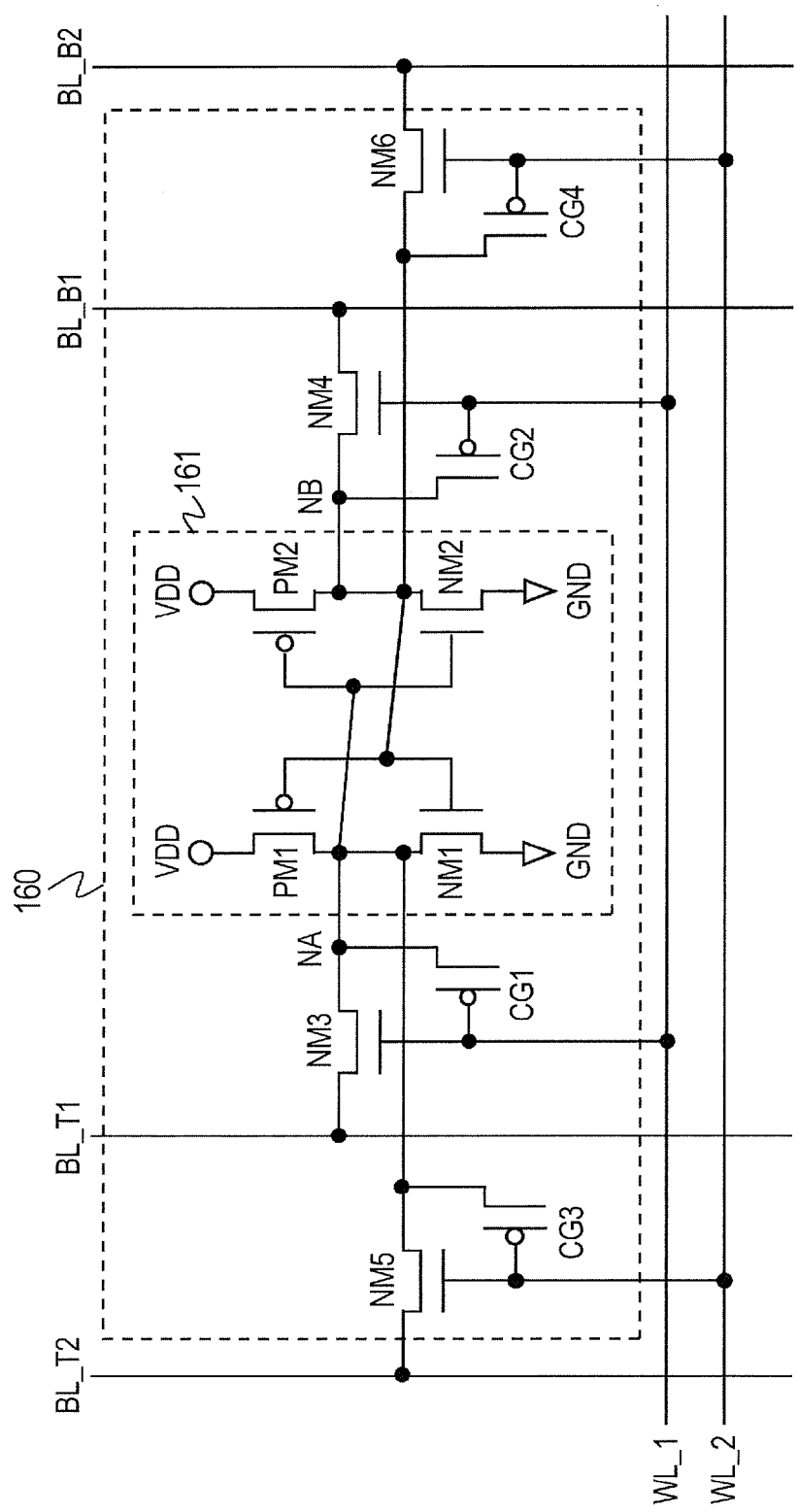
FIG. 10 is a circuit diagram showing a fourth configuration example of an SRAM cell included in the semiconductor device shown in FIG. 1.

Here, the above explanation on the SRAM cell 160 is based on the case where the SRAM cell 160 is a single-port SRAM cell. The SRAM cell 160 however may also be a dual-port SRAM cell. FIG. 10 shows a configuration example of a cell 160 as a dual-port SRAM cell. In the example of FIG. 10, a second word line WL_2 and a second bit line pair BL_T2 and BL_B2 are installed. A third transfer transistor NM5 couples the bit line BL_T2 to a first memory node NA. Then a transfer fourth transistor NM6 couples the bit line BL_B2 to the second memory node NB. Capacitances CG3 and CG4 of a P-channel type are configured in the same manner as capacitances CG1 and CG2. The capacitances CG3 and CG4 have electrostatic capacitances between the memory nodes NA and NB and the word line WL2.

Second Embodiment

The first embodiment according to the present invention has been explained on the basis of the case where capacitances CG1 and CG2 having electrostatic capacitances between a word line WL and memory nodes NA and NB are P-channel type MIS capacitances. The present embodiment is explained on the basis of a modified case where the capacitances CG1 and CG2 included in an SRAM cell 160 according to the first embodiment are replaced with N-channel type MIS capacitances.

Figure 11:
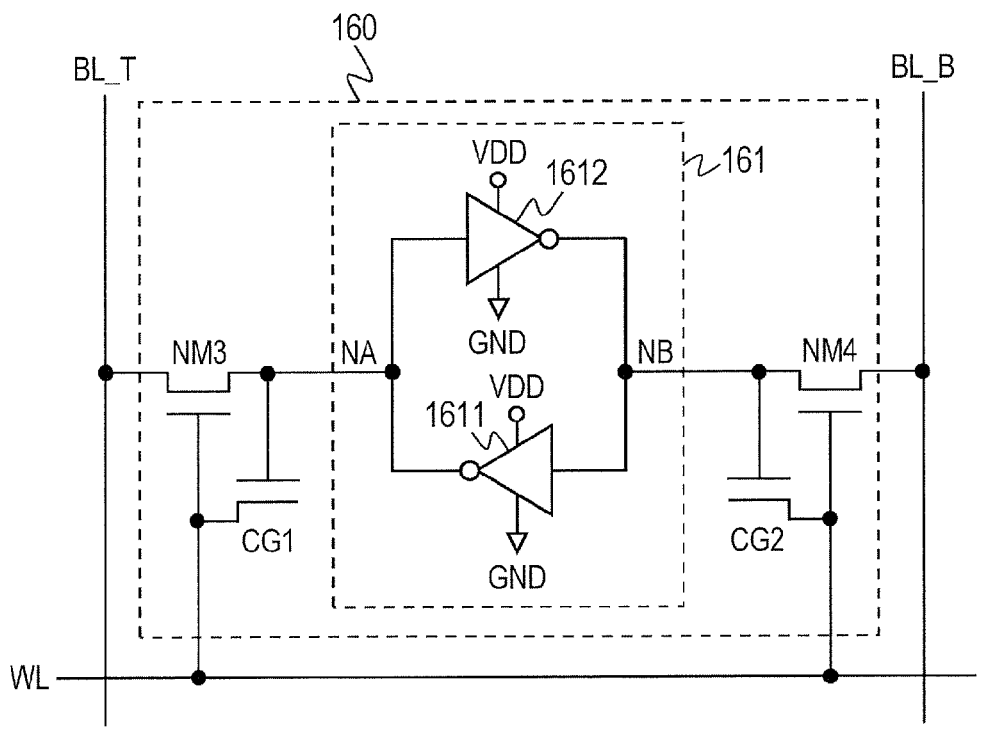
FIG. 11 is a circuit diagram showing a first configuration example of an SRAM cell included in a semiconductor device according to a second embodiment of the present invention.
Figure 12:
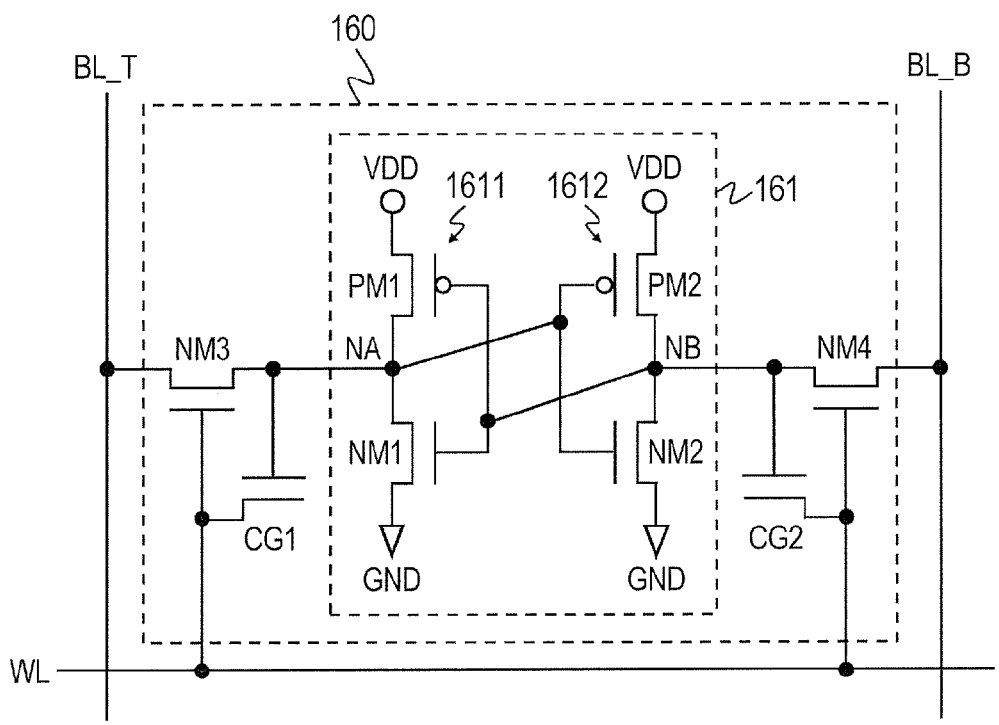
FIG. 12 is a circuit diagram showing a second configuration example of an SRAM cell included in a semiconductor device according to the second embodiment of the present invention.
Figure 13:
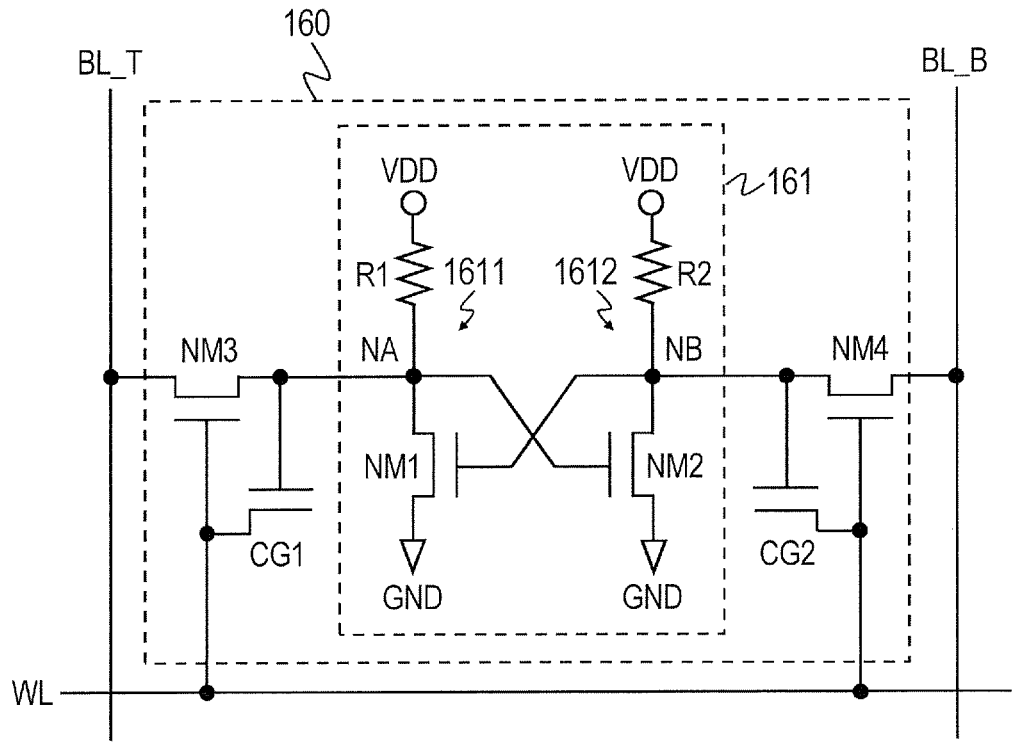
FIG. 13 is a circuit diagram showing a third configuration example of an SRAM cell included in a semiconductor device according to the second embodiment of the present invention.

The configuration examples of the cases where the capacitances CG1 and CG2 in the configuration examples of an SRAM cell 160 shown in FIGS. 2 to 4 are replaced with N-channel type MIS capacitances are shown in FIGS. 11 to 13. The capacitances CG1 and CG2 in FIGS. 11 to 13 that are N-channel type MIS capacitances may have a structure similar to an NMOS transistor, namely a structure having two $N^+$ diffusion regions corresponding to a source and a drain. Further, the capacitances CG1 and CG2 may have a structure having only one $N^+$ diffusion region corresponding to one of a source and a drain. In an N-channel type MIS capacitance too, a P-type semiconductor region (substrate or well) is coupled to a low reference voltage (GND) so that the interface between an $N^+$ diffusion region and the P-type semiconductor region (P-type semiconductor substrate or P-well) may take a reverse bias.

Figure 14:
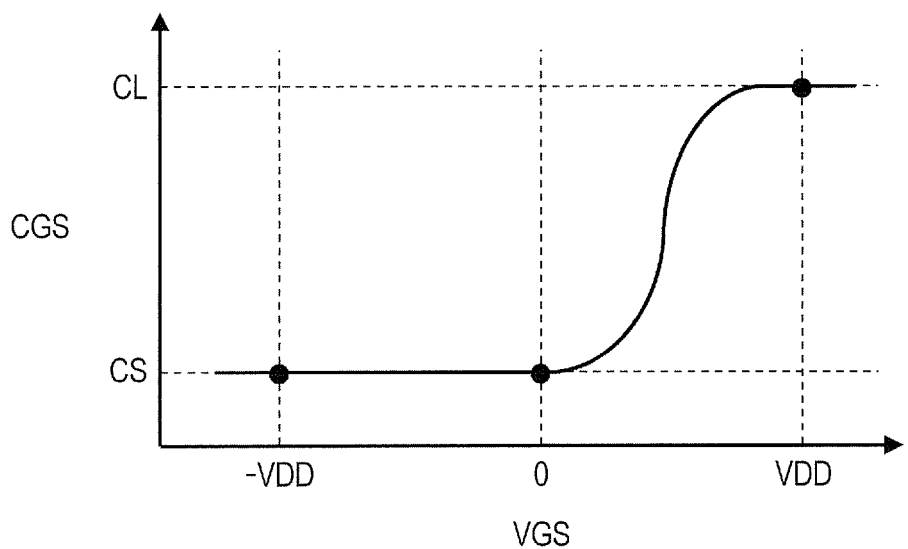
FIG. 14 is a graph showing the relationship between a gate-to-source voltage VGS and a gate-to-source electrostatic capacitance CGS in an N-channel type MIS capacitance shown in FIGS. 11 to 13.

In an N-channel type MIS capacitance, an electrostatic capacitance CGS is varied in response to a gate-to-source voltage VGS. FIG. 14 is a graph showing the relationship between a gate-to-source voltage VGS and a gate-to-source electrostatic capacitance CGS in each of the capacitances CG1 and CG2 that are N-channel type MIS capacitances. As shown in FIG. 14, when VGS is +VDD, namely a gate is at a HIGH (VDD) level and a source is at a LOW (GND) level, each of the capacitances CG1 and CG2 has a relatively large electrostatic capacitance CL. This is because, since the gate potential is sufficiently higher than the potential (GND) of a P-type semiconductor region (substrate or well), an N-channel (N-type inversion layer) is formed and the potential of the N-type inversion layer is identical to the potential (GND) of the source. On this occasion, the N-type inversion layer is electrically coupled to the source, only the electrostatic capacitance of a gate oxide film exists between the gate and the source, and the electrostatic capacitance CGS between the gate and the source takes a relatively large value CL.

When VGS is zero or lower in contrast, each of the capacitances CG1 and CG2 has a relatively small electrostatic capacitance CS. When each of the gates of the capacitances CG1 and CG2 is at a HIGH (VDD) level and each of the sources is also at the HIGH (VDD) level for example, although an N-type inversion layer is formed by potential difference between the gate and a P-type semiconductor region (substrate or well), the N-type inversion layer takes the VDD potential at the moment when the N-type inversion layer is coupled to the source of the HIGH (VDD) level. On this occasion, the gate also has the VDD potential and hence the N-type inversion layer disappears (the N-type inversion layer cannot exist). Consequently, the electrostatic capacitance of the gate oxide film that has existed between the gate and the source disappears and the electrostatic capacitance CGS between the gate and the source takes a relatively small value CS.

Further, when each of the gates of the capacitances CG1 and CG2 is at the LOW (GND) level, the gate and the P-type semiconductor region (substrate or well) have a substantially identical potential. Consequently, the N-type inversion layer is not formed. The source of the LOW (GND) level or the HIGH (VDD) level is electrically separated (zero or reverse bias) from the P-type semiconductor region (substrate or well) and hence the electrostatic capacitance CGS between the gate and the source takes a relatively small value CS.

In FIGS. 11 to 13, in the first capacitance CG1, the source is coupled to the word line WL and the gate is coupled to the first memory node NA. Likewise, in the second capacitance CG2, the source is coupled to the word line WL and the gate is coupled to the second memory node NB. The variation of the electrostatic capacitance CGS between the word line WL and the first memory node NA in the first capacitance CG1 coupled in this way is the same as the case of a P-channel type MIS capacitance shown in FIGS. 2 to 4. That is, the first capacitance CG1 varies the electrostatic capacitance CGS between the word line WL and the first memory node NA as follows in response to the selective state of the word line WL and the voltage retained in the first memory node NA. The same goes for the second capacitance CG2.

(1) When the word line is in a nonselective state (LOW (GND) level) and the first memory node NA is at a HIGH (VDD) level, the gate-to-source voltage VGS is biased to +VDD. Consequently, the first capacitance CG1 has a relatively large electrostatic capacitance CL.

(2) When the word line is in a nonselective state (LOW (GND) level) and the first memory node NA is at the LOW (GND) level, the gate-to-source voltage VGS is biased to 0 V. Consequently, the first capacitance CG1 has a relatively small electrostatic capacitance CS.

(3) When the word line is in a selective state (HIGH (VDD) level), the gate-to-source voltage VGS is biased to 0 V or −VDD. Consequently, the first capacitance CG1 has a relatively small electrostatic capacitance CS regardless of whether the first memory node NA is at the HIGH (VDD) level or at a LOW (GND) level.

Consequently, read operation of an SRAM cell 160 according to the present embodiment is similar to the first embodiment explained with the timing chart of FIG. 6. Consequently, an SRAM cell 160 according to the present embodiment can rapidly raise the potential of a first memory node NA retaining a HIGH level in response to the shift of a word line WL to a selective state. As a result, in the present embodiment, it is possible to sufficiently suppress data inversion (data destruction) caused by a poor SNM during reading and contribute to the increase of a read speed.

Further, when a word line is in a nonselective state, a second capacitance CG2 coupled to a second memory node NB retaining a LOW level only has a relatively small electrostatic capacitance CS. As a result, the potential rise of the second memory node NB retaining the LOW level can be suppressed so as to be smaller and hence bit inversion is not caused.

Furthermore, an SRAM cell 160 according to the present embodiment can mitigate the deterioration of reliability caused by the continuous overdrive of a second drive transistor NM2 by lowering the potential of a first memory node NA storing a HIGH level to VDD at the latter half of the selection period of a word line WL as shown in the period T3 of FIG. 6.

Yet further, an SRAM cell 160 according to the present embodiment has capacitances CG1 and CG2 coupled to memory nodes NA and NB and hence can improve soft error resistance.

In addition, an SRAM cell 160 according to the present embodiment may be a dual-port SRAM cell in the same manner as the first embodiment stated above.

Third Embodiment

The first and second embodiments of the present invention have been explained on the basis of the case where capacitances CG1 and CG2 having electrostatic capacitances between a word line WL and memory nodes NA and NB are MIS capacitances. A first capacitance CG1 however is only required to have (A) a relatively large electrostatic capacitance CL when a word line WL is in a nonselective state (usually a LOW level) and also a first memory node NA retains a HIGH level and (B) a relatively small electrostatic capacitance CS when the word line WL is in the nonselective state (usually the LOW level) and also the first memory node NA retains the LOW level. That is, the first capacitance CG1 is only required to be a variable-capacitance element varying the electrostatic capacitance between the word line WL and the first memory node NA as stated above in response to a potential difference between the word line WL and the first memory node NA. The same goes for a second capacitance CG2.

A variable-capacitance element having such a characteristic is not limited to a P-channel type or N-channel type MIS capacitance having a structure described in the first and second embodiments. In a CMOS process, a MIS capacitance (MOS capacitance) having another structure and using an electrostatic capacitance between a gate polysilicon (gate electrode) and a diffusion region may also be formed. In a MIS capacitance using an electrostatic capacitance between a gate polysilicon (gate electrode) and a diffusion region, the width of a depletion layer or the existence of an inversion layer varies by an applied voltage and hence it is possible to form an element having a characteristic of increasing the electrostatic capacitance non-linearly in accordance with the rise of the applied voltage.

Figure 15:
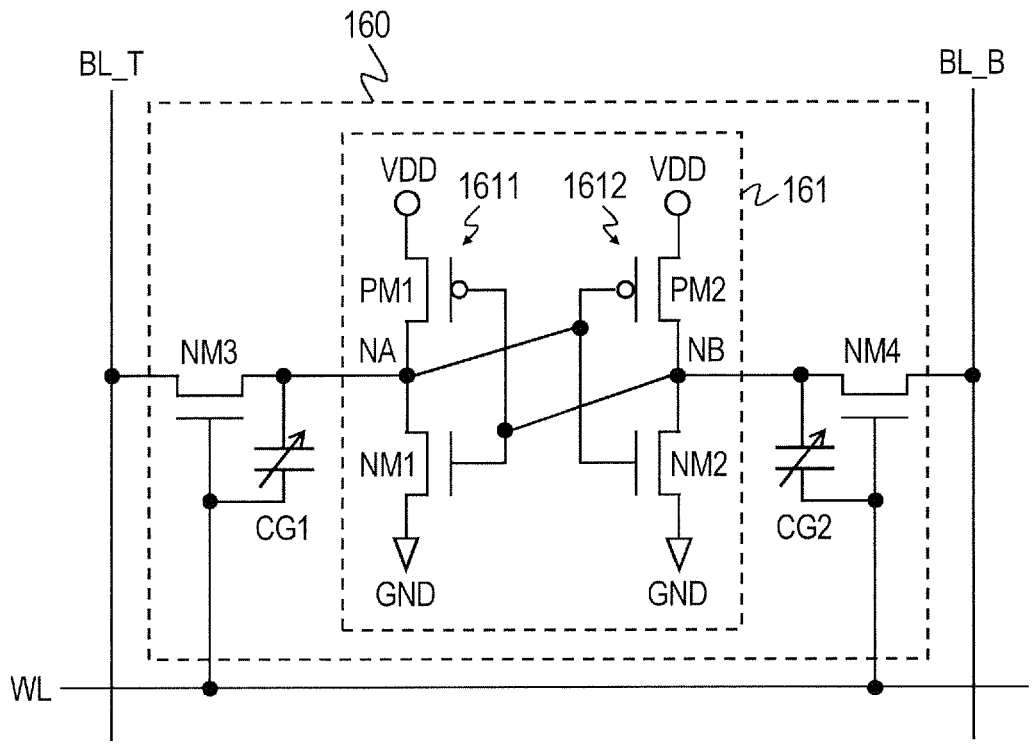
FIG. 15 is a circuit diagram showing a configuration example of an SRAM cell included in a semiconductor device according to a third embodiment of the present invention.

A configuration example of the case where the capacitances CG1 and CG2 in the configuration example of the SRAM cell 160 shown in FIG. 3 are replaced with variable-capacitance elements having the aforementioned characteristic is shown in FIG. 15. Here, the capacitances CG1 and CG2 included in the configuration examples of an SRAM cell 160 shown in FIGS. 2 and 4 may be replaced with variable-capacitance elements having the aforementioned characteristic.

Figure 16:
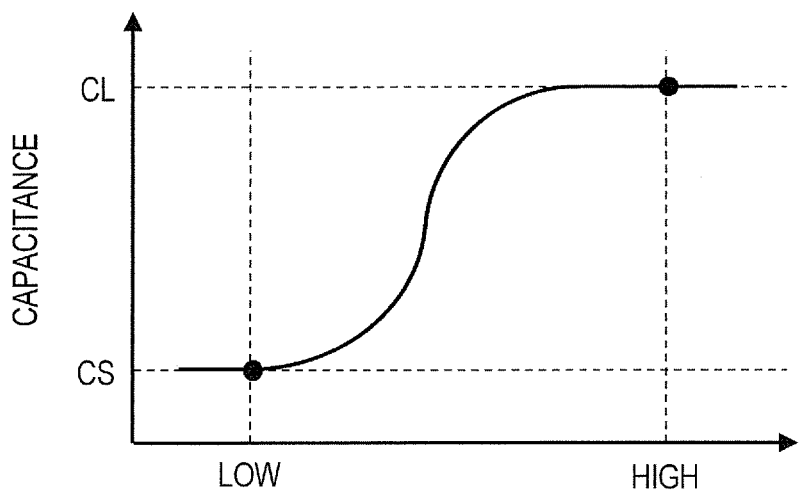
FIG. 16 is a graph showing the relationship between an electrostatic capacitance of a variable-capacitance element shown in FIG. 15 and a bit value stored in a memory node (namely a potential of a memory node)

FIG. 16 is a graph showing the relationship between an electrostatic capacitance of the variable capacitance CG1 or CG2 and a bit value stored in a memory node (namely, an electric potential of a memory node) during the period when a word line WL is in a nonselective state (LOW level).

Read operation of an SRAM cell 160 according to the present embodiment is similar to the first embodiment explained with the timing chart of FIG. 6. Consequently, an SRAM cell 160 according to the present embodiment can rapidly raise the potential of a first memory node NA retaining a HIGH level in response to the shift of a word line WL to a selective state. As a result, in the present embodiment, it is possible to sufficiently suppress data inversion (data destruction) caused by a poor SNM during reading and contribute to the increase of a read speed.

Further, when a word line is in a nonselective state, a second capacitance CG2 coupled to a second memory node NB retaining a LOW level only has a relatively small electrostatic capacitance CS. As a result, the potential rise of the second memory node NB retaining the LOW level can be suppressed so as to be smaller and hence bit inversion is not caused.

Furthermore, an SRAM cell 160 according to the present embodiment can mitigate the deterioration of reliability caused by the continuous overdrive of a second drive transistor NM2 by lowering the potential of a first memory node NA storing a HIGH level to VDD at the latter half of the selection period of a word line WL as shown in the period T3 of FIG. 6.

Yet further, an SRAM cell 160 according to the present embodiment has capacitances CG1 and CG2 coupled to memory nodes NA and NB and hence can improve soft error resistance.

In addition, an SRAM cell 160 according to the present embodiment may be a dual-port SRAM cell in the same manner as the first embodiment stated above.

Fourth Embodiment

An SRAM 11 incorporating SRAM cells 160 explained in the first to third embodiments of the invention makes it possible to improve a read margin (SNM) and increase a read speed without deteriorating a write margin. Meanwhile, technologies for improving a write margin (write assist technologies) are proposed. For example, Japanese Unexamined Patent Publication No. 2007-12214 and Japanese Unexamined Patent Publication No. 2011-65727 propose write assist technologies. An SRAM cell 160 explained in the first to third embodiments has the same structure comprising a word line, bit lines, and a power source as an ordinary SRAM cell and hence can easily employ the write assist technologies. By applying write assist technologies to an SRAM cell 160, the write margin of the SRAM cell 160 improves and the electric power of an SRAM can be reduced further.

Figure 17:
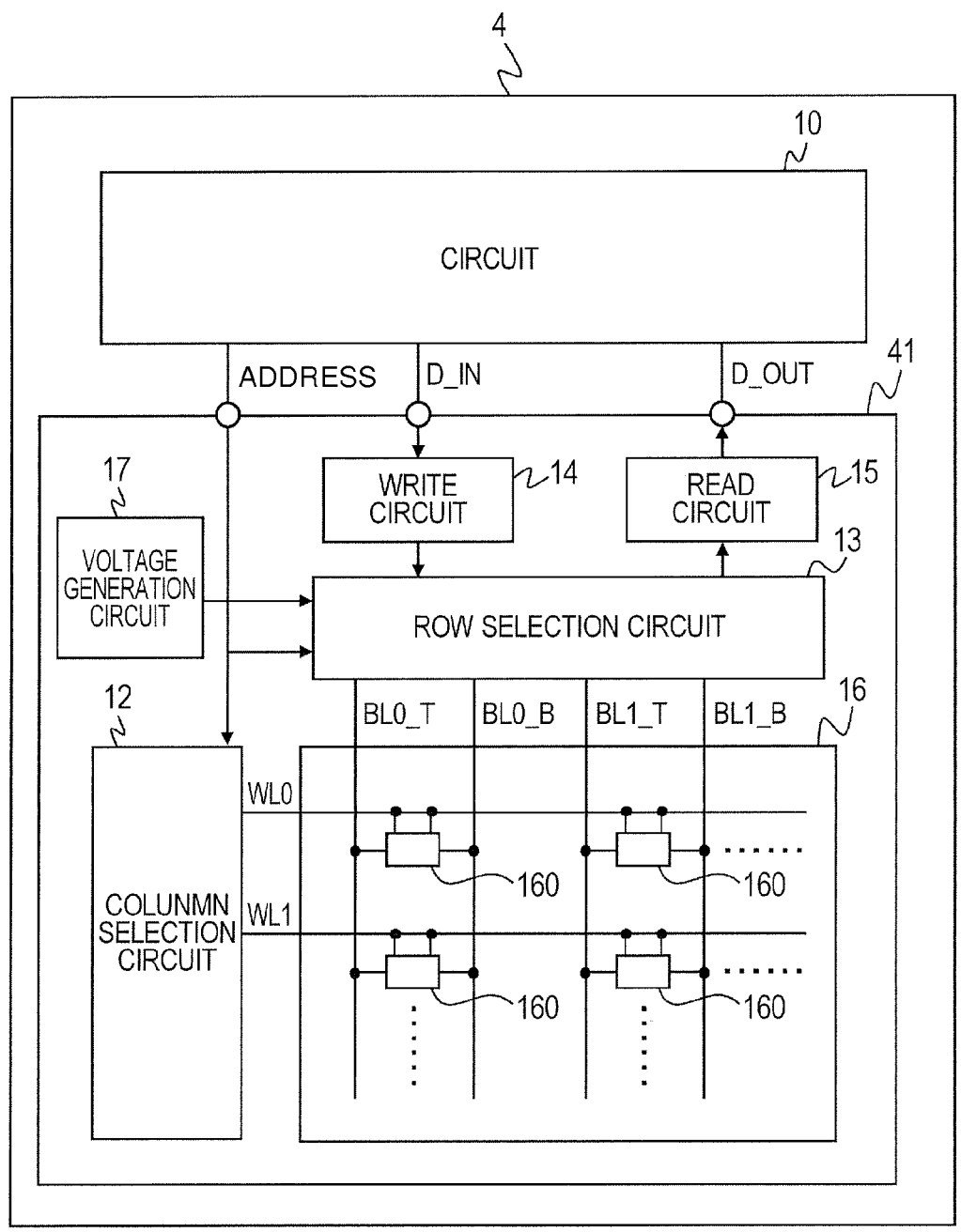
FIG. 17 is a block diagram showing a first configuration example of a semiconductor device according to a fourth embodiment of the present invention.

In the write assist technology disclosed in Japanese Unexamined Patent Publication No. 2007-12214, the power source voltage of an SRAM cell selected during a write period is set at a voltage lower than a VDD level in order to improve a write margin. A configuration example of a semiconductor device 4 including an SRAM 41 employing the write assist technology disclosed in Japanese Unexamined Patent Publication No. 2007-12214 is shown in FIG. 17. The SRAM 41 in FIG. 17 applies a voltage lower than a VDD level generated in a voltage generation circuit 17 to the power source of an SRAM cell 160 included in a cell row selected during the write period. A write margin improves thereby and hence the electric power of an SRAM can be reduced further by synergetic effects with the improvement of a read margin (SNM) described in the first to third embodiments.

Figure 18:
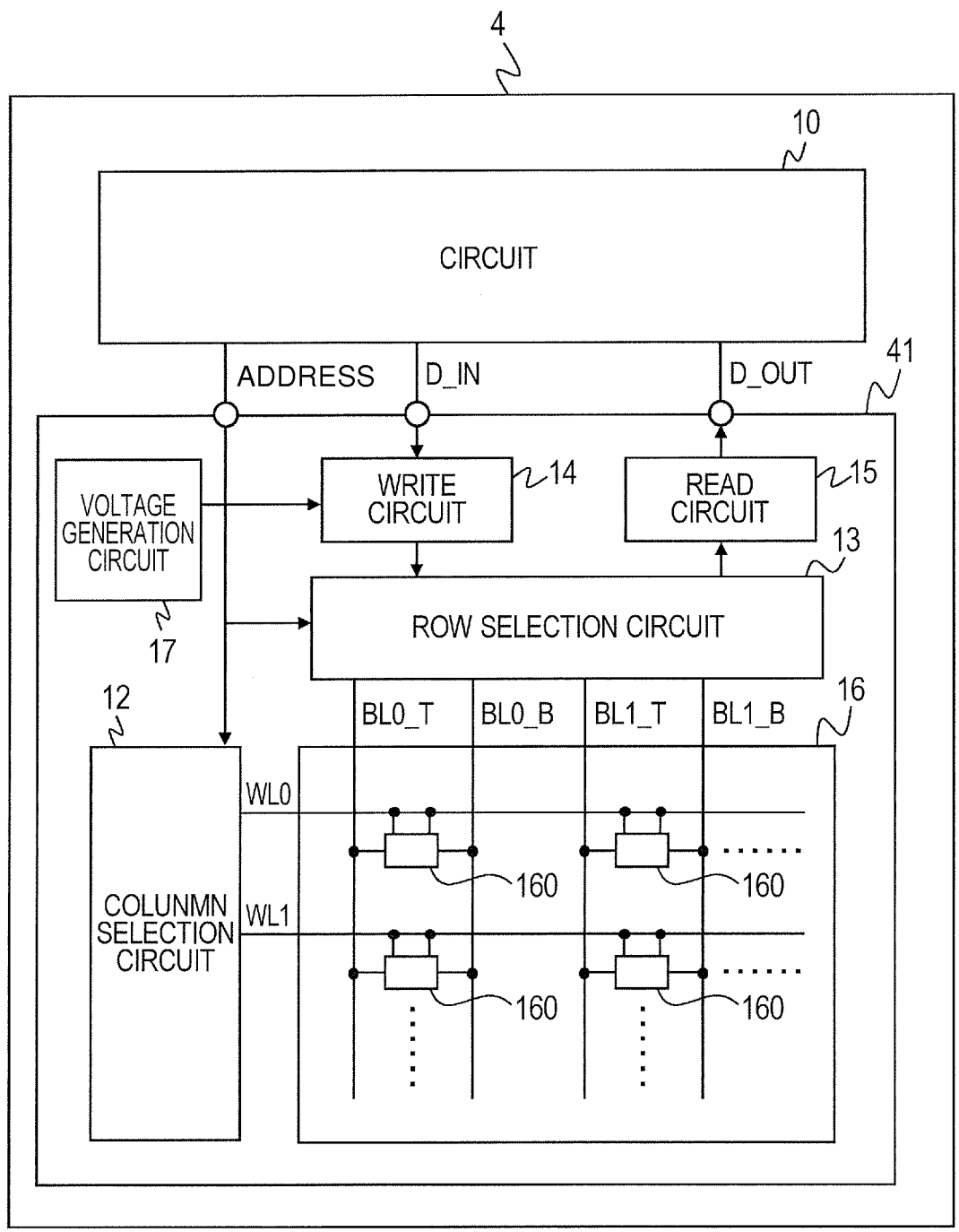
FIG. 18 is a block diagram showing a second configuration example of a semiconductor device according to the fourth embodiment of the present invention.

In the write assist technology disclosed in Japanese Unexamined Patent Publication No. 2011-65727, a Low level of a bit line pair of BL_T and BL_B selected during a write period is set at a negative voltage. A configuration example of a semiconductor device 4 including an SRAM 41 employing the write assist technology disclosed in Japanese Unexamined Patent Publication No. 2011-65727 is shown in FIG. 18. The SRAM 41 in FIG. 18 applies a negative voltage generated in a voltage generation circuit 17 to a bit line pair BL_T and BL_B selected through a write circuit 14 and a row selection circuit 13. A write margin improves thereby and hence the electric power of an SRAM can be reduced further by synergetic effects with the improvement of a read margin (SNM) described in the first to third embodiments.

Figure 19:
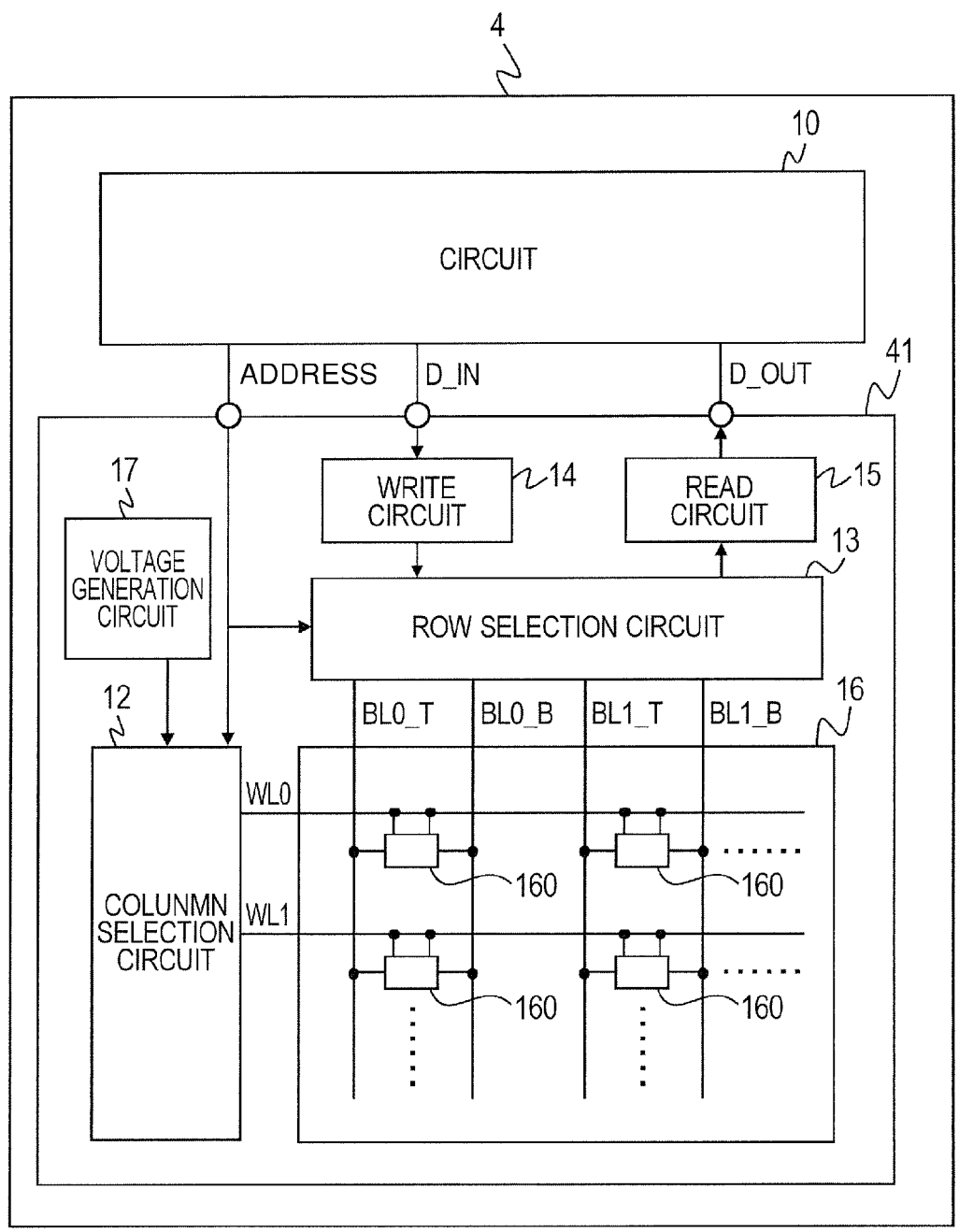
FIG. 19 is a block diagram showing a third configuration example of a semiconductor device according to the fourth embodiment of the present invention.

Further, a word line WL selected during a write period may be set at a voltage higher than a VDD level in order to improve a write margin. A configuration example of a semiconductor device 4 including an SRAM 41 employing such a write assist technology is shown in FIG. 19. The SRAM 41 in FIG. 19 applies a voltage higher than a VDD level generated in a voltage generation circuit 17 to a word line WL selected through a column selection circuit 12. A write margin improves thereby and hence the electric power of an SRAM can be reduced further by synergetic effects with the improvement of a read margin (SNM) described in the first to third embodiments.

Here, detailed explanations on specific operations of the write assist technologies and mechanisms of improving a write margin are omitted because they are obvious by referring to the aforementioned literatures.

Other Embodiments

In the first and second embodiments stated above, the cases where capacitances CG1 and CG2 have a relatively small electrostatic capacitance CS when a word line WL is in a selective state (HIGH level) are shown. The capacitances CG1 and CG2 however may have a large electrostatic capacitance (an electrostatic capacitance CL for example) when the word line WL is in the selective state (HIGH level).

Further, as described in the first to third embodiments of the invention, it is preferable that capacitances CG1 and CG2 have a substantially identical characteristic on electrostatic capacitance. That is, it is preferable that, when voltages between sources and gates are identical, the capacitances CG1 and CG2 have a substantially identical electrostatic capacitance and also substantially identical non-linearity (voltage dependency) on electrostatic capacitance. Nevertheless, the capacitances CG1 and CG2 may have characteristics different from each other on electrostatic capacitance.

Furthermore, in the first to third embodiments stated above, the explanations have been made on the basis that a low reference voltage regulating an electric potential of a word line in a nonselective state and the electric potential of a memory node at a LOW level is a ground potential GND. The low reference voltage however may be a voltage other than GND as long as it is a voltage lower than VDD.

In addition, the present invention is not limited only to the aforementioned embodiments and it goes without saying that the present invention can be modified variously within a range not deviating from the aforementioned tenors of the present invention.

What is claimed is:

1. A semiconductor device comprising:
a plurality of memory cells;
first and second bit lines installed corresponding to the memory cells; and
a plurality of word lines installed corresponding to the memory cells,
wherein each of the memory cells includes:
first and second memory nodes;
a flip-flop circuit to set one of the first and second memory nodes at a first potential and the other of the first and second memory nodes at a second potential which is lower than the first potential, in response to stored data;
a first transfer transistor to control the connection between the first memory node and the first bit line in response to whether a corresponding word line is in a selective state or in a nonselective state;
a second transfer transistor to control the connection between the second memory node and the second bit line in response to whether the corresponding word line is in the selective state or in the nonselective state; and
a first capacitive element coupled between the first memory node and the word line; and
a second capacitive element coupled between the second memory node and the word line;
wherein the first capacitive element has a first electrostatic capacitance when the corresponding word line is in the nonselective state and the first memory node has the first potential, and has a second electrostatic capacitance which is smaller than the first electrostatic capacitance when the word line is in the nonselective state and the first memory node has the second potential.

2. A semiconductor device according to claim 1, wherein the second capacitive element has a third electrostatic capacitance when the word line is in the nonselective state and the second memory node has the first potential and has a fourth electrostatic capacitance which is smaller than the third electrostatic capacitance when the word line is in the nonselective state and the second memory node has the second potential.

3. A semiconductor device according to claim 2, wherein the first electrostatic capacitance is substantially identical to the third electrostatic capacitance, and
wherein the second electrostatic capacitance is substantially identical to the fourth electrostatic capacitance.

4. A semiconductor device according to claim 2, wherein each of the first and second capacitive elements has a metal insulator semiconductor (MIS) structure.

5. A semiconductor device according to claim 4, wherein the metal insulator semiconductor (MIS) structure of each of the first and second capacitive elements includes:
a first conductivity type semiconductor region;
an insulation layer formed over a surface region of the first conductivity type semiconductor region;
a conductive layer formed over the insulation layer; and
a second conductivity type semiconductor region formed adjacent to the surface region,
wherein the conductive layer of the first capacitive element is coupled to one of the first memory node and the word line, and the second conductivity type semiconductor region of the first capacitive element is coupled to the other of the first memory node and the word line, and
wherein the conductive layer of the second capacitive element is coupled to one of the second memory node and the word line, and the second conductivity type semiconductor region of the second capacitive element is coupled to the other of the second memory node and the word line.

6. A semiconductor device according to claim 5, wherein the first conductivity type is N type and the second conductivity type is P type.

7. A semiconductor device according to claim 5, wherein the first conductivity type is P type and the second conductivity type is N type.

8. A semiconductor device according to claim 1, wherein the flip-flop circuit includes:
a first inverter having an input terminal coupled to the second memory node and an output terminal coupled to the first memory node; and
a second inverter having an input terminal coupled to the first memory node and an output terminal coupled to the second memory node.

9. A semiconductor device according to claim 8, wherein the first inverter comprises a field-effect type first drive transistor having a gate coupled to the second memory node and a drain coupled to the first memory node, and
wherein the second inverter comprises a field-effect type second drive transistor having a gate coupled to the first memory node and a source coupled to the second memory node.

10. A semiconductor device according to claim 8, wherein each of the first and second inverters is a complementary metal oxide semiconductor (CMOS) inverter.

11. A semiconductor device according to claim 8,
wherein the first inverter has a first PMOS transistor and a first NMOS transistor coupled to each other in series between a high reference voltage and a low reference voltage,
wherein gates of the first PMOS transistor and the first NMOS transistor are coupled to the second memory node,
wherein drains of the first PMOS transistor and the first NMOS transistor are coupled to the first memory node,
wherein the second inverter has a second PMOS transistor and a second NMOS transistor coupled to each other in series between the high reference voltage and the low reference voltage,
wherein gates of the second PMOS transistor and the second NMOS transistor are coupled to the first memory node, and
wherein drains of the second PMOS transistor and the second NMOS transistor are coupled to the second memory node.

12. A semiconductor device according to claim 8,
wherein the first inverter has a first drive transistor to drive the first memory node and a first resistance load, and
wherein the second inverter has a second drive transistor to drive the second memory node and a second resistance load.

13. A semiconductor device comprising:
a plurality of memory cells;
first and second bit lines installed corresponding to the memory cells; and
a plurality of word lines installed corresponding to the memory cells,
wherein each of the memory cells includes:
  first and second memory nodes;
  a flip-flop circuit to set one of the first and second memory nodes at a first potential and the other of the first and second memory nodes at a second potential which is lower than the first potential in response to stored data;
  a first transfer transistor to control the connection between the first memory node and the first bit line in response to whether a corresponding word line is in a selective state or in a nonselective state;
  a second transfer transistor to control the connection between the second memory node and the second bit line in response to whether the word line is in the selective state or in the nonselective state;
  a first capacitive element coupled between the first memory node and the word line, and
  a second capacitive element having the same MIS structure as the first capacitive element,
wherein the first capacitive element has a metal insulator semiconductor (MIS) structure including:
  a first conductivity type semiconductor region;
  an insulation layer formed over a surface region of the first conductivity type semiconductor region;
  a conductive layer formed over the insulation layer; and
  a second conductivity type semiconductor region formed adjacent to the surface region,
  wherein the conductive layer is coupled to one of the first memory node and the word line, and
  wherein the second conductivity type semiconductor region is coupled to the other of the first memory node and the word line.

14. A semiconductor device according to claim 13, wherein:

the second capacitive element is coupled between the second memory node and the word line.

15. A semiconductor device according to claim 14,
wherein the first capacitive element has a first electrostatic capacitance when the word line is in the nonselective state and the first memory node has the first potential, and has a second electrostatic capacitance which is smaller than the first electrostatic capacitance when the word line is in the nonselective state and the first memory node has the second potential, and
wherein the second capacitive element has a third electrostatic capacitance when the word line is in the nonselective state and the second memory node has the first potential, and has a fourth electrostatic capacitance which is smaller than the third electrostatic capacitance when the word line is in the nonselective state and the second memory node has the second potential.

16. A semiconductor device according to claim 15,
wherein the first electrostatic capacitance is substantially identical to the third electrostatic capacitance, and
wherein the second electrostatic capacitance is substantially identical to the fourth electrostatic capacitance.

17. A semiconductor device according to claim 13, wherein the first conductivity type is N type and the second conductivity type is P type.

18. A semiconductor device according to claim 13, wherein the first conductivity type is P type and the second conductivity type is N type.

19. A semiconductor device according to claim 13, wherein the flip-flop circuit includes:
  a first inverter having an input terminal coupled to the second memory node and an output terminal coupled to the first memory node; and
  a second inverter having an input terminal coupled to the first memory node and an output terminal coupled to the second memory node.

20. A semiconductor device according to claim 19,
wherein the first inverter comprises a field-effect type first drive transistor having a gate coupled to the second memory node and a drain coupled to the first memory node, and
wherein the second inverter comprises a field-effect type second drive transistor having a gate coupled to the first memory node and a source coupled to the second memory node.

21. A semiconductor device comprising:
a plurality of memory cells;
first and second bit lines installed corresponding to the memory cells; and
a plurality of word lines installed corresponding to the memory cells,
wherein each of the memory cells includes:
  first and second memory nodes;
  a flip-flop circuit to set one of the first and second memory nodes at a first potential and the other of the first and second memory nodes at a second potential which is lower than the first potential in response to stored data;
  a first transfer transistor to control the connection between the first memory node and the first bit line in response to whether the word line is in a selective state or in a nonselective state;
  a second transfer transistor to control the connection between the second memory node and the second bit line in response to whether the word line is in the selective state or in the nonselective state;

a first capacitive element coupled between the first memory node and the word line;

a second capacitive element coupled between the second memory node and the word line;

a third wiring functioning as a gate electrode for both the first transfer transistor and the first capacitive element; and a fourth wiring functioning as a gate electrode for both the second transfer transistor and the second capacitive element.

22. A semiconductor device according to claim 21, wherein in a plan view layout of each memory cell:

the third and fourth wirings extend in a common first direction of said each memory cell and are parallel to one another but do not overlap in a second direction which is orthogonal to the first direction.

23. A semiconductor device according to claim 21, wherein the flip-flop circuit comprises:

a first PMOS transistor and a first NMOS transistor coupled to each other in series between a high reference voltage and a low reference voltage, wherein gates of the first PMOS transistor and the first NMOS transistor are coupled to the second memory node and drains of the first PMOS transistor and the first NMOS transistor are coupled to the first memory node, and a second PMOS transistor and a second NMOS transistor coupled to each other in series between the high reference voltage and the low reference voltage, wherein gates of the second PMOS transistor and the second NMOS transistor are coupled to the first memory node and drains of the second PMOS transistor and the second NMOS transistor are coupled to the second memory node; and a first wiring functioning as a gate electrode for both the first PMOS transistor and the first NMOS; and a second wiring functioning as a gate electrode for both the second PMOS transistor and the second NMOS transistor.

24. A semiconductor device according to claim 23, wherein in a plan view layout of each memory cell:

the first and second wirings extend in a common first direction of said each memory cell and are parallel to one another but do not overlap in a second direction which is orthogonal to the first direction;

the third and fourth wirings extend in the common first direction of said each memory cell and are parallel to one another but do not overlap in the second direction;

the first and fourth wirings are collinear; and the second and third polysilicon wirings are collinear.

* * * * *